US010439073B2

(12) United States Patent
Yamazaki

(10) Patent No.: US 10,439,073 B2
(45) Date of Patent: Oct. 8, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/921,730

(22) Filed: Mar. 15, 2018

(65) Prior Publication Data

US 2018/0204948 A1 Jul. 19, 2018

Related U.S. Application Data

(63) Continuation of application No. 13/959,862, filed on Aug. 6, 2013, now Pat. No. 9,929,276.

(30) Foreign Application Priority Data

Aug. 10, 2012 (JP) ................................ 2012-178724

(51) Int. Cl.
*H01L 29/786* (2006.01)
*H01L 29/66* (2006.01)

(52) U.S. Cl.
CPC .... *H01L 29/7869* (2013.01); *H01L 29/66969* (2013.01); *H01L 29/78696* (2013.01)

(58) Field of Classification Search
CPC .......... H01L 29/7869; H01L 29/78696; H01L 29/66969
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |

(Continued)

FOREIGN PATENT DOCUMENTS

| | | | |
|---|---|---|---|
| CN | 102867854 A | 1/2013 | |
| EP | 1737044 A | 12/2006 | |

(Continued)

OTHER PUBLICATIONS

Tae Jung Kim et al., Journal of the Korean Physical Society, vol. 59, No. 6, Dec. 2011, pp. 3396-3400.*

(Continued)

*Primary Examiner* — Mohammed R Alam
(74) *Attorney, Agent, or Firm* — Fish & Richardson P.C.

(57) ABSTRACT

A highly reliable semiconductor device exhibiting stable electrical characteristics is provided. Further, a highly reliable semiconductor device is provided. Oxide semiconductor films are stacked so that the conduction band has a well-shaped structure. Specifically, a transistor having a multi-layer structure is manufactured in which a second oxide semiconductor film having a crystalline structure is stacked over a first oxide semiconductor film, and at least a third oxide semiconductor film is provided over the second oxide semiconductor film. When a buried channel is formed in the transistor, few oxygen vacancies are generated and the reliability of the transistor is improved.

14 Claims, 20 Drawing Sheets

(56) References Cited

U.S. PATENT DOCUMENTS 6,146,928 A 11/2000 Ishiguro et al.
6,294,274 B1 9/2001 Kawazoe et al.
6,563,174 B2 5/2003 Kawasaki et al.
6,727,522 B1 4/2004 Kawasaki et al.
7,049,190 B2 5/2006 Takeda et al.
7,061,014 B2 6/2006 Hosono et al.
7,064,346 B2 6/2006 Kawasaki et al.
7,105,868 B2 9/2006 Nause et al.
7,211,825 B2 5/2007 Shih et al.
7,282,782 B2 10/2007 Hoffman et al.
7,297,977 B2 11/2007 Hoffman et al.
7,323,356 B2 1/2008 Hosono et al.
7,385,224 B2 6/2008 Ishii et al.
7,402,506 B2 7/2008 Levy et al.
7,411,209 B2 8/2008 Endo et al.
7,453,065 B2 11/2008 Saito et al.
7,453,087 B2 11/2008 Iwasaki
7,462,862 B2 12/2008 Hoffman et al.
7,468,304 B2 12/2008 Kaji et al.
7,501,293 B2 3/2009 Ito et al.
7,601,984 B2 10/2009 Sano et al.
7,674,650 B2 3/2010 Akimoto et al.
7,732,819 B2 6/2010 Akimoto et al.
7,994,500 B2 8/2011 Kim et al.
8,058,645 B2 11/2011 Jeong et al.
8,148,779 B2 4/2012 Jeong et al.
8,188,480 B2 5/2012 Itai
8,202,365 B2 6/2012 Umeda et al.
8,203,143 B2 6/2012 Imai
8,274,078 B2 9/2012 Itagaki et al.
8,384,080 B2 2/2013 Taniguchi et al.
8,492,757 B2 7/2013 Sakata et al.
8,502,221 B2 8/2013 Yamazaki
8,669,556 B2 3/2014 Yamazaki et al.
8,680,522 B2 3/2014 Yamazaki et al.
8,728,883 B2 5/2014 Yamazaki et al.
8,767,442 B2 7/2014 Matsuzaki et al.
8,883,556 B2 11/2014 Yamazaki
8,890,152 B2 11/2014 Yamazaki et al.
8,952,377 B2 2/2015 Yamazaki et al.
8,994,021 B2 3/2015 Yamazaki et al.
9,059,295 B2 6/2015 Yamazaki
9,196,745 B2 11/2015 Yamazaki et al.
9,281,358 B2 3/2016 Yamazaki et al.
9,318,613 B2 4/2016 Yamazaki
9,331,208 B2 5/2016 Yamazaki et al.
9,443,984 B2 9/2016 Yamazaki
9,530,897 B2 12/2016 Yamazaki et al.
9,634,082 B2 4/2017 Yamazaki et al.
2001/0046027 A1 11/2001 Tai et al.
2002/0056838 A1 5/2002 Ogawa
2002/0132454 A1 9/2002 Ohtsu et al.
2003/0189401 A1 10/2003 Kido et al.
2003/0218222 A1 11/2003 Wager, III et al.
2004/0038446 A1 2/2004 Takeda et al.
2004/0127038 A1 7/2004 Carcia et al.
2005/0017302 A1 1/2005 Hoffman
2005/0199959 A1 9/2005 Chiang et al.
2006/0035452 A1 2/2006 Carcia et al.
2006/0043377 A1 3/2006 Hoffman et al.
2006/0091793 A1 5/2006 Baude et al.
2006/0108529 A1 5/2006 Saito et al.
2006/0108636 A1 5/2006 Sano et al.
2006/0110867 A1 5/2006 Yabuta et al.
2006/0113536 A1 6/2006 Kumomi et al.
2006/0113539 A1 6/2006 Sano et al.
2006/0113549 A1 6/2006 Den et al.
2006/0113565 A1 6/2006 Abe et al.
2006/0169973 A1 8/2006 Isa et al.
2006/0170111 A1 8/2006 Isa et al.
2006/0197092 A1 9/2006 Hoffman et al.
2006/0208977 A1 9/2006 Kimura
2006/0228974 A1 10/2006 Thelss et al.
2006/0231882 A1 10/2006 Kim et al.
2006/0238135 A1 10/2006 Kimura
2006/0244107 A1 11/2006 Sugihara et al.
2006/0284171 A1 12/2006 Levy et al.
2006/0284172 A1 12/2006 Ishii
2006/0292777 A1 12/2006 Dunbar
2007/0024187 A1 2/2007 Shin et al.
2007/0046191 A1 3/2007 Saito
2007/0052025 A1 3/2007 Yabuta
2007/0054507 A1 3/2007 Kaji et al.
2007/0072439 A1 3/2007 Akimoto et al.
2007/0090365 A1 4/2007 Hayashi et al.
2007/0108446 A1 5/2007 Akimoto
2007/0152217 A1 7/2007 Lai et al.
2007/0172591 A1 7/2007 Seo et al.
2007/0187678 A1 8/2007 Hirao et al.
2007/0187760 A1 8/2007 Furuta et al.
2007/0194379 A1 8/2007 Hosono et al.
2007/0252928 A1 11/2007 Ito et al.
2007/0272922 A1 11/2007 Kim et al.
2007/0287296 A1 12/2007 Chang
2008/0006877 A1 1/2008 Mardilovich et al.
2008/0038882 A1 2/2008 Takechi et al.
2008/0038929 A1 2/2008 Chang
2008/0050595 A1 2/2008 Nakagawara et al.
2008/0073653 A1 3/2008 Iwasaki
2008/0083950 A1 4/2008 Pan et al.
2008/0106191 A1 5/2008 Kawase
2008/0128689 A1 6/2008 Lee et al.
2008/0129195 A1 6/2008 Ishizaki et al.
2008/0166834 A1 7/2008 Kim et al.
2008/0182358 A1 7/2008 Cowdery-Corvan et al.
2008/0224133 A1 9/2008 Park et al.
2008/0254569 A1 10/2008 Hoffman et al.
2008/0258139 A1 10/2008 Ito et al.
2008/0258140 A1 10/2008 Lee et al.
2008/0258141 A1 10/2008 Park et al.
2008/0258143 A1 10/2008 Kim et al.
2008/0296568 A1 12/2008 Ryu et al.
2009/0068773 A1 3/2009 Lai et al.
2009/0073325 A1 3/2009 Kuwabara et al.
2009/0081826 A1 3/2009 Cowdery-Corvan et al.
2009/0114910 A1 5/2009 Chang
2009/0134399 A1 5/2009 Sakakura et al.
2009/0152506 A1 6/2009 Umeda et al.
2009/0152541 A1 6/2009 Maekawa et al.
2009/0206332 A1 8/2009 Son et al.
2009/0250693 A1 10/2009 Jeong et al.
2009/0278122 A1 11/2009 Hosono et al.
2009/0280600 A1 11/2009 Hosono et al.
2010/0038641 A1 2/2010 Imai
2010/0065844 A1 3/2010 Tokunaga
2010/0092800 A1 4/2010 Itagaki et al.
2010/0109002 A1 5/2010 Itagaki et al.
2010/0320458 A1 12/2010 Umeda et al.
2010/0320459 A1 12/2010 Umeda et al.
2011/0089417 A1 4/2011 Yamazaki et al.
2011/0140100 A1 6/2011 Takata et al.
2011/0156026 A1 6/2011 Yamazaki et al.
2011/0193083 A1 8/2011 Kim et al.
2011/0215328 A1 9/2011 Morosawa et al.
2011/0298027 A1 12/2011 Isobe et al.
2012/0032163 A1 2/2012 Yamazaki
2012/0043541 A1 2/2012 Godo et al.
2012/0063205 A1 3/2012 Matsuzaki et al.
2012/0119205 A1 5/2012 Taniguchi et al.
2012/0129288 A1 5/2012 Kobayashi et al.
2012/0132903 A1 5/2012 Yamazaki et al.
2012/0181534 A1* 7/2012 Hatano .............. G11C 16/0483 257/43
2012/0305913 A1 12/2012 Yamazaki et al.
2012/0319183 A1* 12/2012 Yamazaki ........... H01L 29/7782 257/288
2013/0320330 A1 12/2013 Yamazaki
2013/0320334 A1 12/2013 Yamazaki et al.
2013/0334533 A1 12/2013 Yamazaki
2014/0001465 A1 1/2014 Yamazaki
2014/0008647 A1 1/2014 Yamazaki
2014/0014947 A1 1/2014 Yamazaki
2014/0027762 A1 1/2014 Tsurume et al.
2014/0042433 A1 2/2014 Yamazaki

(56) References Cited

U.S. PATENT DOCUMENTS

| | | | |
|---|---|---|---|
| 2014/0042435 | A1 | 2/2014 | Yamazaki |
| 2014/0042436 | A1 | 2/2014 | Yamazaki |
| 2014/0042437 | A1 | 2/2014 | Yamazaki |
| 2014/0042438 | A1 | 2/2014 | Yamazaki |
| 2014/0264521 | A1 | 9/2014 | Matsuzaki et al. |
| 2015/0053977 | A1 | 2/2015 | Yamazaki |
| 2015/0311347 | A1 | 10/2015 | Yamazaki |
| 2016/0225908 | A1 | 8/2016 | Yamazaki |
| 2016/0240694 | A1 | 8/2016 | Yamazaki et al. |
| 2016/0380107 | A1 | 12/2016 | Yamazaki |
| 2017/0069765 | A1 | 3/2017 | Yamazaki et al. |

FOREIGN PATENT DOCUMENTS

| | | | |
|---|---|---|---|
| EP | 2226847 | A | 9/2010 |
| EP | 2428959 | A | 3/2012 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165528 | A | 6/2006 |
| JP | 2007-096055 | A | 4/2007 |
| JP | 2007-123861 | A | 5/2007 |
| JP | 2009-231613 | A | 10/2009 |
| JP | 2010-016347 | A | 1/2010 |
| JP | 4415062 | | 2/2010 |
| JP | 2010-067954 | A | 3/2010 |
| JP | 2010-177431 | A | 8/2010 |
| JP | 4571221 | | 10/2010 |
| JP | 2011-109079 | A | 6/2011 |
| JP | 2011-138934 | A | 7/2011 |
| JP | 2011-228689 | A | 11/2011 |
| JP | 2011-228695 | A | 11/2011 |
| JP | 2011-243745 | * | 12/2011 |
| JP | 2011-243745 | A | 12/2011 |
| JP | 2012-054547 | A | 3/2012 |
| JP | 2012-084851 | A | 4/2012 |
| JP | 2012-134467 | A | 7/2012 |
| JP | 2012-134475 | A | 7/2012 |
| JP | 2012-151460 | A | 8/2012 |
| JP | 2012-151461 | A | 8/2012 |
| JP | 2012-160679 | A | 8/2012 |
| WO | WO-2004/114391 | | 12/2004 |
| WO | WO-2008/133345 | | 11/2008 |
| WO | WO-2011/122363 | | 10/2011 |
| WO | WO-2011/122364 | | 10/2011 |
| WO | WO-2012/073844 | | 6/2012 |
| WO | WO-2012/073918 | | 6/2012 |
| WO | WO-2012/090973 | | 7/2012 |

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Nathan.A et al., "Amorphous Oxide TFTs: Progress and Issues", SID Digest '12: SID International Symposium Digest of Technical Papers, Jun. 5, 2012, vol. 43, No. 1, pp. 1-4.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Asakuma.N et al., "Crystallization and Reduction of SOL-Gel-Derived Zinc Oxide Films by Irradiation With Ultraviolet Lamp", Journal of SOL-Gel Science and Technology, 2003, vol. 26, pp. 181-184.

Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies In ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTS Array", SID Digest '08: SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "SPINEL,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5) InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m= Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of Zno Thin-Film Transistors With Aluminum Oxide Dielectric Layers", J. Electrochem. Soc. (Journal of Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09: Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Kim.T et al., "Effect of the Ga Ratio on the Dielectric Function of Solution-processed InGaZnO Films", J. Korean Phys. Soc.(Journal of the Korean Physical Society), Dec. 1, 2011, vol. 59, No. 6, pp. 3396-3400.
Chinese Office Action (Application No. 201310345410.5) dated Jul. 5, 2017.

* cited by examiner

SEMICONDUCTOR DEVICE AND METHOD FOR MANUFACTURING THE SAME

CROSS-REFERENCE TO RELATED APPLICATIONS

This application is a continuation of U.S. application Ser. No. 13/959,862, filed Aug. 6, 2013, now allowed, which claims the benefit of a foreign priority application filed in Japan as Serial No. 2012-178724 on Aug. 10, 2012, both of which are incorporated by reference.

BACKGROUND OF THE INVENTION

1. Field of the Invention

The present invention relates to a semiconductor device including an oxide semiconductor and a method for manufacturing the semiconductor device.

In this specification, a semiconductor device generally means a device which can function by utilizing semiconductor characteristics, and an electrooptic device, a semiconductor circuit, and an electronic appliance are all semiconductor devices.

2. Description of the Related Art

In recent years, semiconductor devices have been developed to be used mainly for a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of a CPU or a memory is mounted on a circuit board, for example, a printed wiring board, to be used as one of components of a variety of electronic appliances.

A technique for manufacturing a transistor or the like using an oxide semiconductor film for a channel formation region and applying it to a display device has been attracting attention. Examples of such a transistor include a transistor in which zinc oxide (ZnO) is used as an oxide semiconductor film and a transistor in which $InGaO_3(ZnO)_m$ is used as an oxide semiconductor film.

A technique for manufacturing transistor including an oxide semiconductor film over a light-transmitting substrate and applying it to a switching element or the like of an image display device is disclosed in Patent Documents 1 and 2.

Patent Document 3 discloses a semiconductor device in which a transistor including an oxide semiconductor is provided over a single crystal substrate.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-109079

SUMMARY OF THE INVENTION

The electrical characteristics of a transistor including an oxide semiconductor film are varied by influence of an insulating film in contact with the oxide semiconductor film, that is, by an interface state between the oxide semiconductor film and the insulating film.

Further, a transistor including an oxide semiconductor film in which many oxygen vacancies have been generated in the manufacturing process has low long-term reliability. Therefore, it is required to manufacture a transistor including an oxide semiconductor film which has as few oxygen vacancies as possible. Further, it is required to reduce damage to the oxide semiconductor film which is caused by exposure of the oxide semiconductor film to plasma during or after deposition of the oxide semiconductor film.

In view of the above problems, an object of one embodiment of the present invention is to provide a highly reliable semiconductor device which exhibits stable electrical characteristics. Another object is to manufacture a highly reliable semiconductor device.

A buried-channel transistor in which two or more oxide semiconductor films are stacked so that an oxide semiconductor having a small number of oxygen vacancies serves as a carrier path is manufactured.

Specifically, a transistor having a multi-layer structure is manufactured in which a second oxide semiconductor film having a crystalline structure is stacked over a first oxide semiconductor film, and at least a third oxide semiconductor film is provided over the second oxide semiconductor film.

The second oxide semiconductor film is separated from a silicon insulating film which is located below the second oxide semiconductor film by the first oxide semiconductor film, and the third oxide semiconductor film reduces damage to the second oxide semiconductor film which is caused at the time of exposure to plasma in deposition of a silicon insulating film located over the second oxide semiconductor film or in etching after formation of a conductive film.

One embodiment of the present invention disclosed in this specification is a semiconductor device including a first oxide semiconductor film, a second oxide semiconductor film having a crystalline structure over the first oxide semiconductor film, and a third oxide semiconductor film having a crystalline structure over the second oxide semiconductor film. In the band structure of the semiconductor device, the bottom of a conduction band in the second oxide semiconductor film is deeper from the vacuum level than the bottom of a conduction band in the first oxide semiconductor film and the bottom of a conduction band in the third oxide semiconductor film.

FIG. 1A illustrates an example of a cross section of a transistor. A transistor 410 includes a gate electrode 401, a first gate insulating film 402*a* which is a silicon nitride film, a second gate insulating film 402*b* which is a silicon oxide film, a first oxide semiconductor film 403*a*, a second oxide semiconductor film 403*b*, a third oxide semiconductor film 403*c*, and electrode layers 405*a* and 405*b* functioning as source and drain electrodes, over a substrate 400 having an insulating surface. Further, protective insulating films 407*a* and 407*b* which are silicon oxide films and a protective insulating film 408 which is silicon nitride film are provided over the third oxide semiconductor film 403*c*.

A material of the second oxide semiconductor film having a crystalline structure is selected as appropriate so that the conduction band has a well-shaped structure (also referred to as a well structure). FIG. 1B illustrates an example of the well-shaped structure of the conduction band. Note that the schematic view illustrated in FIG. 1B corresponds to an energy band diagram of a cross section taken along line Y1-Y2 in FIG. 1A and illustrates only a portion where the stack of oxide semiconductor films is positioned between the silicon nitride films.

If silicon or carbon, which is an element belonging to Group 14, is contained in the oxide semiconductor film as an impurity, it serves as a donor and the oxide semiconductor film becomes an n-type oxide semiconductor film. Therefore, the concentration of Si contained in each of the first and third oxide semiconductor films (the concentration obtained by secondary ion mass spectrometry (SIMS)) is lower than or equal to $3\times10^{18}/cm^3$, preferably lower than or equal to $3\times10^{17}/cm^3$. Further, the concentration of carbon contained in each of the first and third oxide semiconductor films is lower than or equal to $3\times10^{18}/cm^3$, preferably lower than or equal to $3\times10^{17}/cm^3$. In particular, in order that a large amount of impurities such as elements belonging to Group 14 are not mixed into the second oxide semiconductor film, it is preferable that the second oxide semiconductor film serving as a carrier path be provided between or surrounded by the first and third oxide semiconductor films. In other words, the first and third oxide semiconductor films can also be referred to as barrier layers which prevent mixing of elements belonging to Group 14 such as silicon to the second oxide semiconductor film. Since the barrier layers are provided above and below the second oxide semiconductor film, needless to say, the second oxide semiconductor film hardly contains impurities such as elements belonging to Group 14. For example, the Si concentration of the second oxide semiconductor film is lower than or equal to $3\times10^{18}/cm^3$, preferably lower than or equal to $3\times10^{17}/cm^3$, and the carbon concentration thereof is lower than or equal to $3\times10^{18}/cm^3$, preferably lower than or equal to $3\times10^{17}/cm^3$.

Such a stacked-layer structure enables the second oxide semiconductor film to serve as a carrier path, so that carriers travel through a region having a low content of oxygen vacancies. Since carriers flow through the region which is separated from the silicon insulating films which are located above and below the stack of the oxide semiconductor films, influence of the oxygen vacancies can be reduced.

If hydrogen or moisture is contained as an impurity in the stack of oxide semiconductor films, it serves as a donor and the oxide semiconductor films become n-type oxide semiconductor films; therefore, in order to achieve a well-shaped structure, it is valuable to provide a protective film (a nitride insulating film, typically a silicon nitride film, or the like) for preventing the entry of hydrogen or moisture from the outside, above and below the stack of oxide semiconductor films.

Another embodiment of the present invention disclosed in this specification is a semiconductor device including a first nitride insulating film, a first oxide semiconductor film over the first nitride insulating film, a second oxide semiconductor film having a crystalline structure over the first oxide semiconductor film, a third oxide semiconductor film having a crystalline structure over the second oxide semiconductor film, and a second nitride insulating film over the third oxide semiconductor film. In the semiconductor device, the bottom of a conduction band in the second oxide semiconductor film is deeper from the vacuum level than the bottom of a conduction band in the first oxide semiconductor film and the bottom of a conduction band in the third oxide semiconductor film. The semiconductor device can have higher reliability by including the first nitride insulating film and the second nitride insulating film.

Each of the oxide semiconductor films included in the multi-layer structure contains at least indium (In) at a concentration higher than or equal to $1\times10^{19}/cm^3$ and is deposited using a sputtering target with which a film can be formed by an AC sputtering method or a DC sputtering method. When the sputtering target contains indium, the conductivity is increased; therefore, deposition by an AC sputtering method or a DC sputtering method is facilitated. A material which can be represented as $InM1_XZn_YO_Z$ ($X\geq1$, $Y>1$, $Z>0$, and M1 is a metal element such as Ga or Hf) is used as each of materials of the first and third oxide semiconductor films. Note that in the case where Ga is contained in the materials of the first and third oxide semiconductors, when the proportion of Ga is high, specifically, when a material which can be represented by $InM1_XZn_YO_Z$ where X is larger than 10 is used, powder might be generated in deposition, and it is made difficult to perform deposition by an AC sputtering or a DC sputtering; therefore, such a material is not suitable as a sputtering target.

A material which can be represented as $InM2_XZn_YO_Z$ ($X\geq1$, $Y\geq X$, $Z>0$, and M2 is a metal element such as Ga or Sn) is used as the material of the second oxide semiconductor film. Further, indium tin oxide that has a composition which does not contain M2, i.e., the composition in which X is 0, or a material which contains indium oxide as a main component can be used for the second oxide semiconductor film.

The materials of the first, second, and third oxide semiconductor films are selected as appropriate so that a well-shaped structure in which the bottom of the conduction band in the second oxide semiconductor film is deeper from the vacuum level than the bottoms of the conduction band in the first and third oxide semiconductor films. Specifically, the second oxide semiconductor film is formed using a material which has a higher indium content than the first and third oxide semiconductor films. The contents of indium, gallium, or the like in the first, second, and third oxide semiconductor films can be compared with each other by time-of-flight secondary ion mass spectrometry (also referred to as TOF-SIMS) or X-ray photoelectron spectrometry (also referred to as XPS). Note that the ionization potential of an oxide semiconductor can be measured by ultraviolet photoelectron spectroscopy (UPS) or the like. Typically, VersaProbe (manufactured by ULVAC-PHI Inc) is used as a measurement apparatus for UPS. Note that electron affinity refers to an energy difference between the vacuum level ($E_{vac}$) and the bottom of the conduction band ($E_c$). An energy band gap ($E_g$) can be measured with a full automatic spectroscopic ellipsometer UT-300. The energy of the conduction band is calculated by deducting the energy band gap from the value of the ionization potential; thus a band structure of a single layer or a stack of layers can be formed. In this way, it can be confirmed that a buried channel is formed using the stacked-layer structure disclosed in this specification. FIGS. 2A and 2B illustrate an example thereof.

FIG. 2A is data which shows energies from the vacuum level to the conduction band which are calculated on the basis of measurement data of a sample by a full automatic spectroscopic ellipsometer UT-300. The sample was formed in the following manner: a 10-nm-thick film was formed in an atmosphere containing oxygen at 100% using a sputtering target of an In—Ga—Zn oxide having an atomic ratio of In:Ga:Zn=1:1:1; a 10-nm-thick film was stacked thereover in an atmosphere containing argon at 100% using a sputtering target of an In—Ga—Zn oxide having an atomic ratio of In:Ga:Zn=3:1:2; and a 10-nm-thick film was stacked thereover in an atmosphere containing oxygen at 100% using a sputtering target of an In—Ga—Zn oxide having an atomic ratio of In:Ga:Zn=1:1:1. FIG. 2B shows a band structure formed on the basis of the data of FIG. 2A. FIG. 2B shows that a well-shaped structure is formed in which the bottom of the conduction band in the second oxide semiconductor film is deeper from the vacuum level than the bottoms of the conduction band in the first and third oxide semiconductor films.

Since the second oxide semiconductor film having a crystalline structure is stacked over the first oxide semiconductor film, they can be referred to as a hetero structure having different crystalline structures. In the case where an oxide semiconductor film which has a crystalline structure and has a composition different from the second oxide semiconductor film is provided as the third oxide semiconductor film over the second oxide semiconductor film, they can be referred to as a hetero structure having different compositions. When the third oxide semiconductor film is deposited over the second oxide semiconductor film having a crystalline structure, the third oxide semiconductor film tends to be a film having a crystalline structure. In this case, it might be difficult to recognize a boundary between the second and third oxide semiconductor films by cross-sectional TEM observation. However, since the degree of crystallinity of the third oxide semiconductor film is lower than that of the second oxide semiconductor film, the boundary can be recognized by the degree of crystallinity. The degree of crystallinity of the first oxide semiconductor film is lower than that of the second oxide semiconductor film.

When the oxide semiconductor film serving as a semiconductor film of the transistor has the above stacked-layer structure, the absorption coefficient due to localized states of a region where a channel is formed or at least the second oxide semiconductor film can be lower than or equal to $3\times10^{-3}$/cm when measured by a constant photocurrent method (CPM) (lower than or equal to $3\times10^{13}/cm^3$ when converted into density of states).

Although one well-shaped structure is formed using the first, second, and the third oxide semiconductor films as an example of the stacked-layer structure, the structure is not particularly limited thereto; a plurality of well-shaped structures may be formed with the second oxide semiconductor film which has a multi-layer structure, and one example thereof is shown in FIG. 3.

As the first, second, and third oxide semiconductor films, any of a c-axis aligned crystalline oxide semiconductor (CAAC-OS) film, a polycrystalline oxide semiconductor film, a microcrystalline oxide semiconductor film, an amorphous oxide semiconductor film, or the like is used. Note that the second oxide semiconductor film is preferably a CAAC-OS film. In this specification and the like, a CAAC-OS film refers to an oxide semiconductor film which includes a crystal part whose c-axis is aligned in a direction substantially perpendicular to the surface of the oxide semiconductor film. A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film. When the third oxide semiconductor film is deposited over the second oxide semiconductor film that is a CAAC-OS film, the third oxide semiconductor film tends to have a crystalline structure and a region which overlaps with and is in contact with the second oxide semiconductor film becomes a CAAC-OS film.

The CAAC-OS film is not completely single crystal nor completely amorphous. The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In each of the crystals included in the CAAC-OS film, a c-axis is aligned in a direction parallel to a normal vector of a surface where the CAAC-OS film is formed or a normal vector of a surface of the CAAC-OS film. Note that the directions of the a-axis and the b-axis of one crystal may be different from those of another crystal. In this specification and the like, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed, i.e., the crystallinity is increased in some cases. Further, when oxygen is added to the CAAC-OS film, crystallinity in a region to which the oxygen is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

The CAAC-OS film is formed using a sputtering target. Here, methods for manufacturing sputtering targets each including an oxide semiconductor having a crystal region in which the direction of the c-axis is parallel to a normal vector of the top surface of the oxide semiconductor will be described (see FIG. 16).

First, raw materials for the sputtering target are weighed (step S101).

Here, an $InO_X$ raw material (a raw material of In), a $GaO_Y$ raw material (a raw material of Ga), and a $ZnO_Z$ raw material (a raw material of Zn) are prepared as raw materials for the sputtering target. Note that X, Y, and Z are each a given positive number; for example, X, Y, and Z are 1.5, 1.5, and 1, respectively. It is needless to say that the above raw materials are an example, and raw materials can be selected as appropriate in order to obtain a desired compound. For example, a $MO_Y$ raw material may be used instead of the $GaO_Y$ raw material. Note that Sn, Hf, or Al can be used as M. Alternatively, the following lanthanoid may be used as M: La, Ce, Pr, Nd, Sm, Eu, Gd, Tb, Dy, Ho, Er, Tm, Yb, or Lu. Although the case where three kinds of raw materials are used is shown as an example in this embodiment, one embodiment of the present invention is not limited thereto. For example, this embodiment may be applied to the case where four or more kinds of raw materials are used or the case where one or two kinds of raw materials are used.

Next, the $InO_X$ raw material, the $GaO_Y$ raw material, and the $ZnO_Z$ raw material are mixed in a predetermined ratio.

For example, the predetermined ratio of the $InO_X$ raw material, the $GaO_Y$ raw material, and the $ZnO_Z$ raw material is 2:2:1, 8:4:3, 3:1:1, 1:1:1, 1:3:2. 4:2:3, 1:1:2, 3:1:4, or 3:1:2 in a molar ratio. With the use of a mixed material having such a ratio, a sputtering target including an oxide semiconductor having a crystal region in which the direction of the c-axis is parallel to a normal vector of the top surface of the oxide semiconductor can be easily obtained.

More specifically, in the case of forming a sputtering target of In—Ga—Zn-based oxide having a composition of In:Ga:Zn=1:1:1 [atomic ratio], the raw materials are weighed so that $In_2O_3$:$Ga_2O_3$:ZnO=1:1:2 [molar ratio].

Note that also in the case where the $MO_Y$ raw material is used instead of the $GaO_Y$ raw material, the ratio of the $InO_X$ raw material, the $MO_Y$ raw material, and the $ZnO_Z$ raw material is 2:2:1, 8:4:3, 3:1:1, 1:1:1, 1:3:2, 4:2:3, 1:1:2, 3:1:4, or 3:1:2 in a molar ratio.

A method for forming the sputtering target using a wet method is described. The raw materials for the sputtering target are weighed, and then, the raw materials are ground and mixed with a ball mill or the like to obtain compound powder. After the mixing of the plurality of raw materials, first baking is performed to generate a crystalline oxide. Then, the crystalline oxide is ground to obtain compound power. The grain size of the compound powder is greater than or equal to 0.01 μm and less than or equal to 1 μm, preferably greater than or equal to 0.01 μm and less than or equal to 0.5 μm, further preferably greater than or equal to 0.01 μm and less than or equal to 0.3 μm. Ion-exchange water, an organic additive, and the like are further mixed into the compound powder to form slurry (step S111).

Then, the slurry is poured into a mold provided with a moisture-permeable filter, so that moisture is removed. The mold may be formed using a metal or an oxide and the upper shape thereof is rectangular or rounded. The mold can be provided with one or more holes at the bottom. With the plural holes, moisture of the slurry can be removed rapidly. A porous resin, cloth, or the like may be used for the filter.

Moisture is removed from the slurry in such a manner that water is removed under reduced pressure through the hole provided at the bottom of the mold into which the slurry is poured. Next, the slurry from which moisture has been removed under reduced pressure is naturally dried. Thus, the slurry from which moisture has been removed is molded into the internal shape of the mold (step S113).

Then, second baking is performed on the molded body in an oxygen ($O_2$) atmosphere at a temperature of 1400° C. (step S114). Through the above-described steps, the sputtering target can be obtained using a wet method.

Next, a method for forming the sputtering target using a dry method is described. The raw materials for the sputtering target are weighed, and then, the raw materials are ground and mixed with a ball mill or the like to obtain compound powder (step S121).

The compound powder obtained is spread over a mold, and pressure is applied thereto with a pressing machine, whereby the raw material powder is molded to obtain a molded body (step S122).

The obtained molded body is placed in a heating apparatus such as an electric furnace and baked in an oxygen ($O_2$) atmosphere at a temperature of 1400° C. (step S123). Note that in this embodiment, a method in which a molding step and a baking step are separated as in step S122 and step S123 is referred to as a cold press method. As a comparison example of a cold press method, a hot press method in which a molding step and a baking step are concurrently performed is described below.

First, the above-described steps up to step S121 are performed. The compound powder obtained is spread over the mold, and pressure is applied with a pressing machine to the compound powder provided on the inner side of the mold while the mold is heated in an argon (Ar) atmosphere at a temperature of 1000° C. In this manner, pressure is applied to the compound powder with the compound powder baked, whereby the compound powder can be molded to obtain a molded body (step S125).

Here, a method for using a sputtering target containing $InGaZnO_4$ is described.

Deposition of a CAAC-OS film using the sputtering target containing $InGaZnO_4$ is described below in detail. First, an ion collides with a sputtering target to separate a sputtered particle having crystallinity. A crystal grain which is included in the sputtering target has a cleavage plane which is parallel to a surface of the sputtering target. The crystal grain has a portion with a weak interatomic bond. At the time of collision of the ion with the crystal grain, the weak interatomic bond is cut. Accordingly, the sputtered particle is separated along the cleavage plane and the portion with the weak interatomic bond to have a flat-plate-like shape.

Alternatively, part of the crystal grain is separated along the cleavage plane as a particle and exposed to plasma, so that a bond is cut from the portion with the weak interatomic bond; as a result, a plurality of sputtered particles is generated.

When an oxygen cation is used as the ion, plasma damage at the deposition can be alleviated. Thus, when the ion collides with the surface of the sputtering target, a reduction in degree of crystallinity of the sputtering target can be prevented.

It is preferable that the separated sputtered particles be positively charged. There is no particular limitation on a timing of when the sputtered particle is positively charged, but it is preferably positively charged by receiving an electric charge when an ion collides. Alternatively, in the case where plasma is generated, the sputtered particle is preferably exposed to plasma to be positively charged. Further alternatively, an ion which is an oxygen cation is preferably bonded to a side surface, a top surface, or a bottom surface of the sputtered particle, whereby the sputtered particle is positively charged.

Next, a situation where a sputtered particle is deposited on a deposition surface (a surface where a film is to be formed) is described in detail.

In deposition, the deposition surface has a surface on which several sputtering particles are deposited. In the case where the sputtered particles are positively charged, the sputtered particles are deposited in a region of the deposition surface, where no sputtered particle has been deposited yet. This is because the sputtered particles which are positively charged repel with each other.

Further, c-axes of crystals of the sputtered particles deposited in the above manner are aligned in a direction perpendicular to the deposition surface; accordingly, a CAAC-OS film is formed.

To form the CAAC-OS film, it is preferable to increase the substrate temperature in deposition, and the substrate temperature is higher than or equal to 200° C. and lower than or equal to 550° C. Note that the CAAC-OS film is a film which contains a large amount of oxygen and has a reduced number of oxygen vacancies.

Further, a manufacturing method is also one embodiment, and one embodiment of the present invention is a method for manufacturing a semiconductor device, including the steps of forming a first oxide semiconductor film over a substrate having an insulating surface, forming a second oxide semiconductor film having a crystalline structure over the first oxide semiconductor film, and forming a third oxide semiconductor film having a crystalline structure over the second oxide semiconductor film, in which crystal growth of the third oxide semiconductor film proceeds from an interface between the third oxide semiconductor and the second oxide semiconductor film. The crystal growth of the third oxide semiconductor film proceeds using, as a seed, a crystal included in the second oxide semiconductor film, i.e., a crystal having a c-axis alignment in a direction substantially perpendicular to the surface. Therefore, the third oxide semiconductor film includes a crystal having c-axis alignment in a direction substantially perpendicular to the surface In the case where steps for sequentially stacking the three oxide semiconductor films in FIG. 1A in which a buried channel is formed are performed successively without exposure to the air, a manufacturing apparatus a top view of which is illustrated in FIG. 17 may be used.

The manufacturing apparatus illustrated in FIG. 17 is single wafer multi-chamber equipment, which includes three sputtering devices 10*a*, 10*b*, and 10*c*, a substrate supply chamber 11 provided with three cassette ports 14 for holding a process substrate, load lock chambers 12*a* and 12*b*, a transfer chamber 13, substrate heating chambers 15 and 16, and the like. Note that a transfer robot for transferring a substrate to be treated is provided in each of the substrate supply chamber 11 and the transfer chamber 13. The atmospheres of the sputtering devices 10*a*, 10*b*, and 10*c*, the transfer chamber 13, and the substrate heating chambers 15 and 16 are preferably controlled so as to hardly contain hydrogen and moisture (i.e., as an inert atmosphere, a reduced pressure atmosphere, or a dry air atmosphere). For example, a preferable atmosphere is a dry nitrogen atmosphere in which the dew point of moisture is −40° C. or lower, preferably −50° C. or lower. An example of a procedure of the manufacturing steps with use of the manufacturing apparatus illustrated in FIG. 17 is as follows. The process substrate is transferred from the substrate supply chamber 11 to the substrate heating chamber 15 through the load lock chamber 12*a* and the transfer chamber 13; moisture attached to the process substrate is removed by vacuum baking in the substrate heating chamber 15; the process substrate is transferred to the sputtering device 10*c* through the transfer chamber 13; and a first oxide semiconductor film S1 is deposited in the sputtering device 10*c*. Then, the process substrate is transferred to the sputtering device 10*a* through the transfer chamber 13 without exposure to air, and a second oxide semiconductor film S2 is deposited in the sputtering device 10*a*. Then, the process temperature is transferred to the sputtering device 10*b* through the transfer chamber 13, and a third oxide semiconductor film S3 is deposited in the sputtering device 10*b*. If needed, the process substrate is transferred to the substrate heating chamber 16 through the transfer chamber 13 without exposure to air and the heat treatment is performed. As described above, with use of the manufacturing apparatus illustrated in FIG. 17, a manufacturing process can proceed without exposure to air. Further, with of the sputtering devices in the manufacturing apparatus in FIG. 17, a process performed without exposure to the air can be achieved by change of the sputtering target. As the sputtering devices in the manufacturing apparatus in FIG. 17, a parallel plate sputtering device, an ion beam sputtering device, a facing-target sputtering device, or the like may be used. In a facing-target type sputtering device, an object surface is separated from plasma and thus damage in deposition is small; therefore, a CAAC-OS film having high crystallinity can be formed.

A high purity gas having a low concentration of impurities such as hydrogen, water, a hydroxyl group, and hydride is used as a deposition gas for depositing the oxide semiconductor film in each of the sputtering devices 10*a*, 10*b*, and 10*c*.

The heat treatment may be performed in the substrate heating chamber 16 under reduced pressure, in a nitrogen atmosphere, in an oxygen atmosphere, in ultra-dry air (air in which the moisture amount is less than or equal to 20 ppm (−55° C. by conversion into a dew point), preferably less than or equal to 1 ppm, more preferably less than or equal to 10 ppb, in the measurement with the use of a dew point meter in the cavity ring down laser spectroscopy (CRDS) system), or in a rare gas (argon, helium, or the like) atmosphere. It is preferable that water, hydrogen, and the like be not contained in the nitrogen atmosphere, in the oxygen atmosphere, in the ultra-dry air, in the rare gas atmosphere, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

The semiconductor device of one embodiment of the present invention includes a transistor including an oxide semiconductor film or a circuit including the transistor. For example, an electronic device which includes, as a component, a semiconductor integrated circuit including an LSI, a CPU, a power device mounted in a power circuit, a memory, a thyristor, a converter, an image sensor, or the like; an electro-optical device typified by a liquid crystal display panel; or a light-emitting display device including a light-emitting element is also included in the category of the semiconductor device.

According one embodiment of the present invention, a highly reliable semiconductor device including an oxide semiconductor exhibiting stable electrical characteristics can be provided. A highly reliable semiconductor device can be manufactured.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, one embodiment of a semiconductor device is described with reference to FIGS. 4A and 4B. In this embodiment, a transistor 311 including a first semiconductor material is provided in a lower portion, and a transistor 411 including a second semiconductor material is provided in an upper portion.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material such as silicon can easily operate at high speed. On the other hand, a transistor including an oxide semiconductor enables charge to be held for a long time owing to its characteristics.

As a substrate 300 used in the semiconductor device, a single crystal semiconductor substrate or a polycrystalline semiconductor substrate made of silicon or silicon carbide, a compound semiconductor substrate made of silicon germanium or the like, a silicon on insulator (SOI) substrate, or the like can be used. A channel formation region of the transistor can be formed in or over the semiconductor substrate. The semiconductor device in FIGS. 4A and 4B is an example in which the channel formation region is formed in the semiconductor substrate to form the transistor in the lower portion.

Figure 1A:
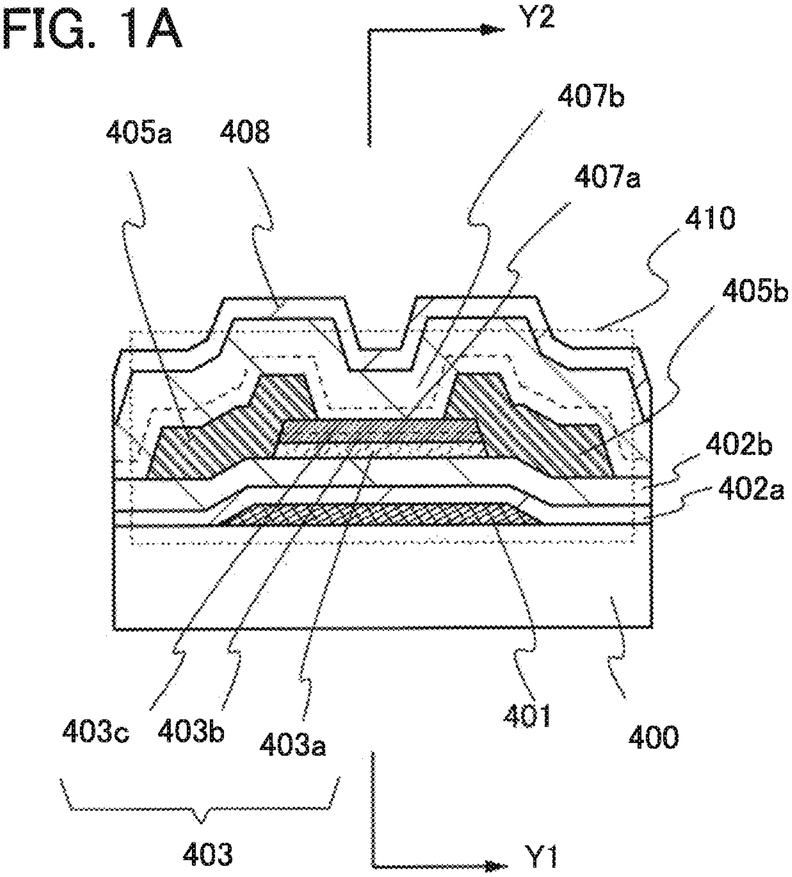
FIG. 1A is a cross-sectional view and FIG. 1B is an example of a band structure illustrating one embodiment of the present invention.
Figure 1B:
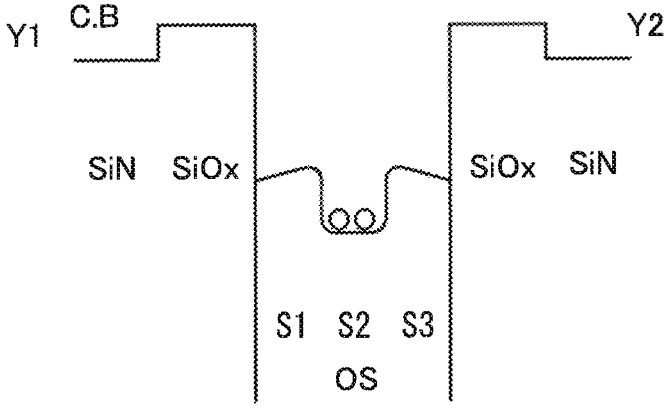
Figure 2A:
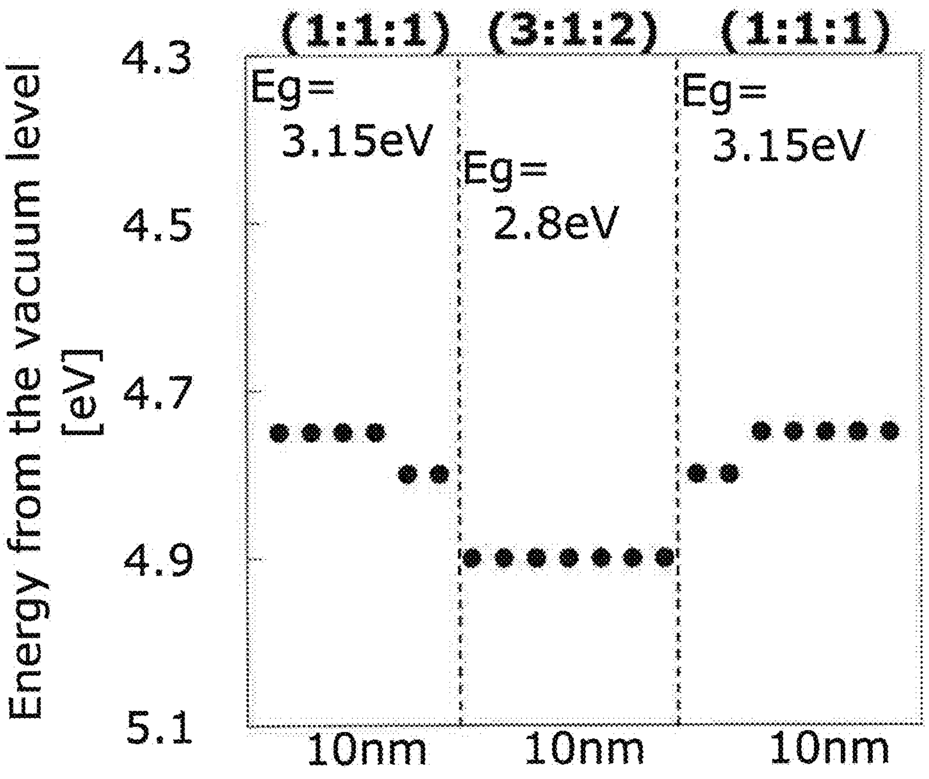
FIGS. 2A and 2B are each a band structure illustrating one embodiment of the present invention.
Figure 2B:
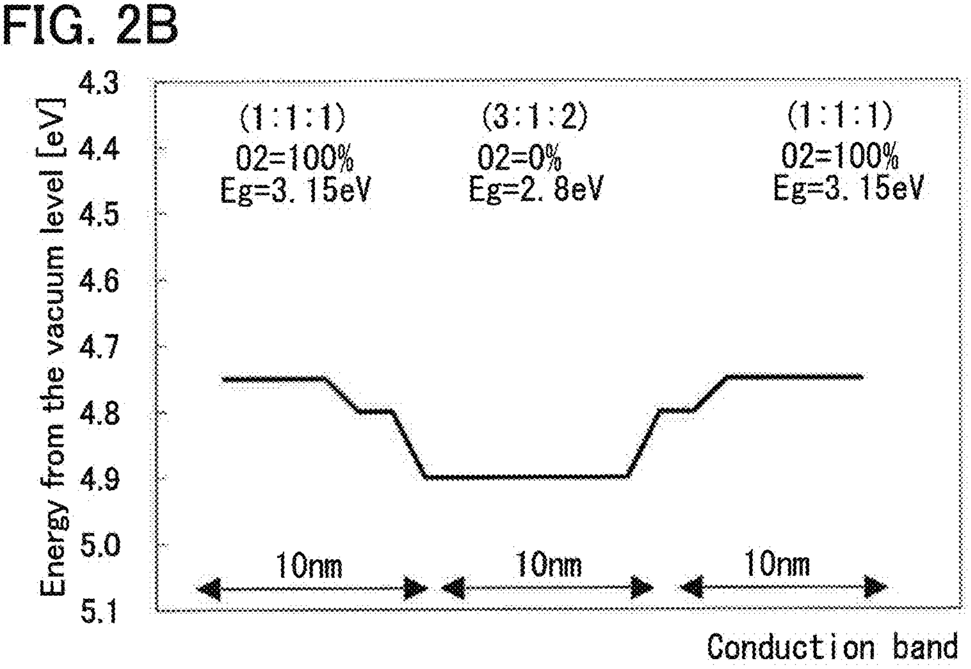
Figure 3:
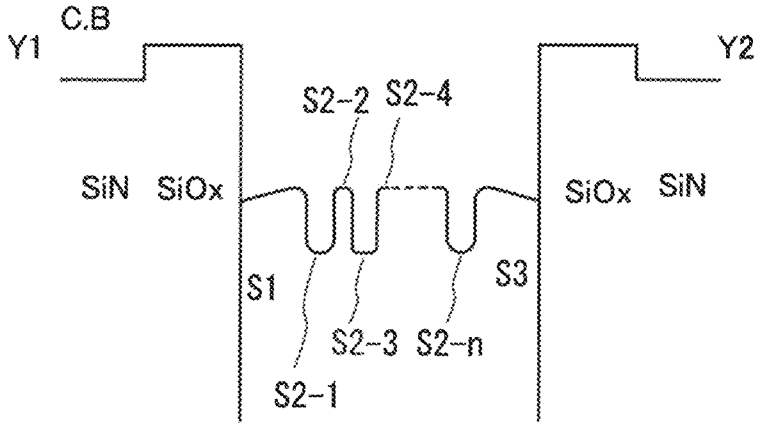
FIG. 3 is an example of a band structure illustrating one embodiment of the present invention.
Figure 4A:
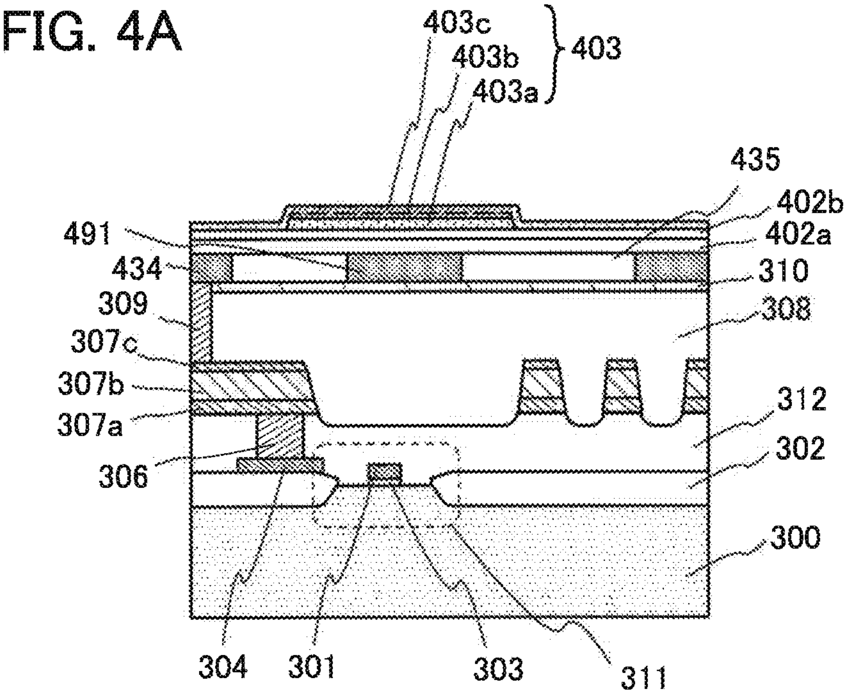
FIGS. 4A and 4B are cross-sectional views illustrating manufacturing steps of one embodiment of the present invention.
Figure 4B:
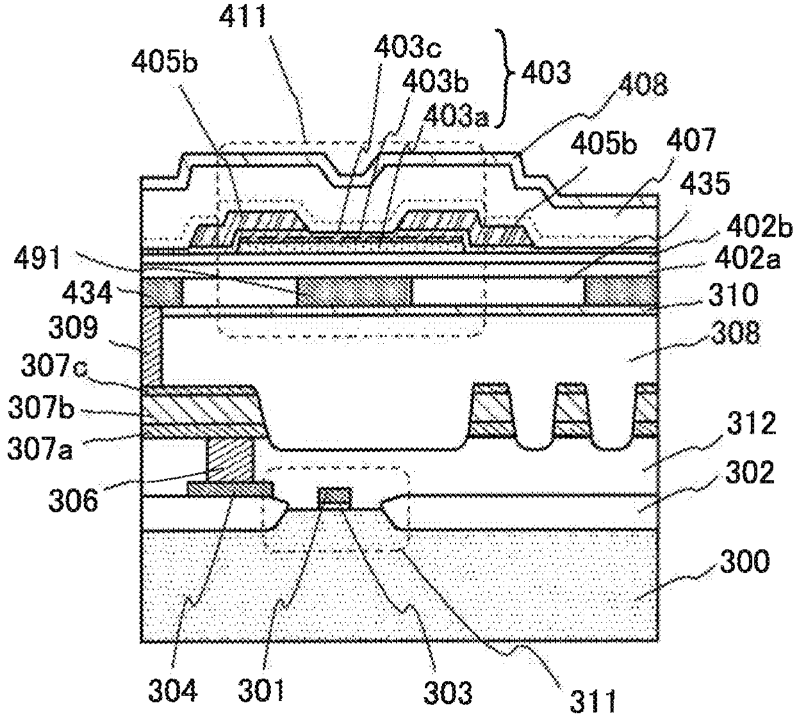

In the semiconductor device in FIGS. 4A and 4B, a single crystal silicon substrate is used as the substrate 300, and the transistor 311 is formed using the single crystal silicon substrate. Single crystal silicon is used as the first semiconductor material. The transistor 311 is a p-channel transistor. The transistor 311 is manufactured by a known manufacturing method. In addition, an n-channel transistor can also be manufactured by the known method on the substrate on which the transistor 311 is formed. A complementary metal oxide semiconductor (CMOS) circuit can be formed by combining an n-channel transistor and a p-channel transistor as appropriate, whereby a variety of circuits can be provided.

The transistor 311 includes a channel formation region, a source region, a drain region, a gate insulating film 303, and a gate electrode 301. An element isolation insulating film 302 is provided to surround the transistor 311, and an electrode layer 304 which is electrically connected to the transistor 311 is provided over the element isolation insulating film 302.

A first interlayer insulating film 312 is formed to cover the electrode layer 304 and the transistor 311. After an opening reaching the electrode layer 304 is formed in the first interlayer insulating film 312 and a conductive film is deposited, planarization is performed by polishing treatment (e.g., chemical mechanical polishing (CMP)). A first wiring layer 306 is formed in the opening of the first interlayer insulating film 312. Then, a conductive film is formed over the first wiring layer 306 and the first interlayer insulating film 312. After that, the conductive film is selectively removed using a mask to form a second wiring layer having a desired shape. In this embodiment, the second wiring layer has a three-layer structure in which a first conductive film 307*a* that is a titanium film, a second conductive film 307*b* that is an aluminum film, and a third conductive film 307*c* that is a titanium film are formed in this order.

Next, a second interlayer insulating film 308 covering the second wiring layer is formed and a barrier layer 310 is stacked. Then, an opening reaching the second wiring layer is formed in the second interlayer insulating film 308 and the barrier layer 310. After that, a conductive film is formed and planarized by CMP or the like, so that a third wiring layer 309 is formed in the opening.

The barrier layer 310 is provided between the transistor 311 in the lower portion and a transistor 411 in the upper portion. The barrier layer 310 is provided in order to prevent impurities such as hydrogen contained in the vicinity of the transistor 311 from diffusing into the transistor 411 in the upper portion. As the barrier layer 310, a material film which releases a small amount of hydrogen or does not release hydrogen in later heat treatment is preferably used. Thus, the barrier layer 310 is preferably formed using a dense inorganic insulating film (e.g., an aluminum oxide film or a silicon nitride film) having a high blocking property of impurities and the like. Specifically, a silicon nitride film which is deposited by a plasma CVD method with supply of a mixed gas of silane ($SiH_4$) and nitrogen ($N_2$) is used as the barrier layer 310.

Next, the transistor 411 is formed over the barrier layer 310.

A conductive film is formed over the barrier layer and selectively etched to form a fourth wiring layer 434 and a gate electrode 491.

After that, an insulating film 435 covering the gate electrode 491 is formed and planarized by CMP or the like.

Then, the first gate insulating film 402*a* and the second gate insulating film 402*b* are formed. The first gate insulating film 402*a* and the second gate insulating film 402*b* each have a thickness greater than or equal to 1 nm and less than or equal to 100 nm and can be formed by a sputtering method, an MBE method, a CVD method, a PLD method, an ALD method, or the like as appropriate. A silicon nitride film is used as the first gate insulating film 402*a*. The second gate insulating film 402*b* is preferably formed using an oxide insulating film including silicon oxide, gallium oxide, aluminum oxide, silicon oxynitride, silicon nitride oxide, hafnium oxide, tantalum oxide, or the like. Because the second gate insulating film 402*b* is in contact with an oxide semiconductor film to be formed later, the second gate insulating film 402*b* preferably contains oxygen in excess of the stoichiometric composition in the layer (the bulk).

A 20-nm-thick silicon oxide film may be deposited as the second gate insulating film 402*b* by a plasma CVD method, and after the deposition, the silicon oxide film may be subjected to radical oxidation treatment by microwave plasma treatment for repairing oxygen vacancies. For example, a high-density plasma apparatus is used under a condition where the power is 3800 W using a power source of 2.45 GHz, the pressure is 106.67 Pa, the substrate temperature is 325° C., the flow rate of argon is 900 sccm, and the flow rate of oxygen is 5 sccm. Here, the high-density plasma apparatus refers to an apparatus which can achieve a plasma density higher than or equal to $1\times10^{11}/cm^3$. For example, plasma is generated by applying a microwave power of 3 kW to 6 kW. Before formation of the second gate insulating film 402*b*, plasma treatment in which nitrous oxide ($N_2O$) and a rare gas are introduced may be performed using a high-density plasma apparatus.

Next, a stack of oxide semiconductor films is formed over the second gate insulating film 402*b*.

The first oxide semiconductor film 403*a* and the second oxide semiconductor film 403*b* are formed, subjected to heat treatment, and then selectively etched using a mask.

In this embodiment, the first oxide semiconductor film 403*a* is deposited at a substrate temperature of room temperature using a target having an atomic ratio of In:Ga:Zn=1:3:2. The first oxide semiconductor film 403*a* has a thickness greater than or equal to 10 nm and less than or equal to 40 nm, preferably greater than or equal to 20 nm and less than or equal to 30 nm. An increase in the thickness of the first oxide semiconductor film 403*a* can prevent diffusion of Si from the base film (insulating film containing silicon). The second oxide semiconductor film 403*b* having a crystalline structure is deposited at a substrate temperature of 400° C. using a target having an atomic ratio of In:Ga:Zn=1:1:1. The second oxide semiconductor film 403*b* is a film including crystals which are c-axis-aligned in a direction substantially perpendicular to the surface and preferably a CAAC-OS film. The second oxide semiconductor film 403*b* has a thickness greater than or equal to 5 nm and less than or equal to 10 nm.

A deposition temperature of the second oxide semiconductor film 403*b* is higher than or equal to 400° C. and lower than or equal to 550° C., preferably higher than or equal to 450° C. and lower than or equal to 500° C. Note that the deposition temperature is within a range of temperatures at which the already formed wiring layer can withstand. The heat treatment is performed in reduced pressure or a nitrogen atmosphere at a temperature higher than or equal to 300° C. and lower than or equal to 600° C., preferably higher than or equal to 300° C. lower than or equal to 500° C., further preferably higher than or equal to 350° C. and lower than or equal to 450° C., to remove excess hydrogen (including water and a hydroxyl group) (to perform dehydration or dehydrogenation) in the oxide semiconductor films. Then, a high-purity oxygen gas or ultra dry air (the amount of moisture is less than or equal to 20 ppm (−55° C. by conversion into a dew point), preferably less than or equal to 1 ppm, further preferably less than or equal to 10 ppb, when measured with a dew point meter of a CRDS system) is introduced to the same furnace while the heating temperature is kept or slowly lowered after the heat treatment. Owing the effect of the oxygen gas, oxygen which is a main component of the oxide semiconductor and which has been reduced at the same time as the step for removing impurities by dehydration or dehydrogenation can be supplied.

Next, the third oxide semiconductor film 403*c* is formed to be in contact with and cover the top and side surfaces of the second oxide semiconductor film 403*b*. In addition, heat treatment for removing excess hydrogen (including water and a hydroxyl group) (performing dehydration or dehydrogenation) in the third oxide semiconductor film 403*c* may be performed, and oxygen may be supplied to the third oxide semiconductor film 403*c* using an oxygen gas.

The third oxide semiconductor film 403*c* is deposited at a substrate temperature of 400° C. using a target having an atomic ratio of In:Ga:Zn=1:3:2. When the third oxide semiconductor film is deposited over the second oxide semiconductor film having a crystalline structure, the third oxide semiconductor film tends to also have a crystalline structure. Further, part of the third oxide semiconductor film 403*c*, i.e., a region which is in contact with the gate insulating film and does not overlap with the second oxide semiconductor film 403*b* tends to have lower crystallinity than a region which overlaps with the second oxide semiconductor film 403*b*. The third oxide semiconductor film 403*c* has a thickness greater than or equal to 10 nm and less than or equal to 40 nm, preferably greater than or equal to 20 nm and less than or equal to 30 nm. In this embodiment, the region of the third oxide semiconductor film 403*c* which overlaps with the second oxide semiconductor film 403*b* includes crystals which are c-axis-aligned in a direction substantially perpendicular to the surface. A cross-sectional view at this stage is illustrated in FIG. 4A.

Then, a conductive film is formed over the third oxide semiconductor film 403*c* and processed to form the electrode layer 405*a* and the electrode layer 405*b* (including a wiring formed with the same layer). Then, wet etching is performed using diluted hydrofluoric acid to reduce the thickness of part of the third oxide semiconductor film 403*c*.

Next, an insulating film 407 is formed to cover the electrode layers 405*a* and 405*b* and a stack 403 of oxide semiconductor films which is exposed. The insulating film 407 can be formed with a single layer or a stack of layers using one or more of the following films formed by a plasma CVD method or a sputtering method: a silicon oxide film, a gallium oxide film, an aluminum oxide film, a silicon nitride film, a silicon oxynitride film, an aluminum oxynitride film, a silicon nitride oxide film, and the like. It is preferable that a first oxide insulating film be formed to cover the stack 403 of oxide semiconductor films under a condition which causes little plasma damage in order to reduce plasma damage, and that a second oxide insulating film be stacked thereover under a deposition condition which allows the film to contain a large amount of oxygen. Note that it is preferable that an oxide insulating film be formed as the insulating film 407 in contact with the stack 403 of oxide semiconductor films because the oxide insulating film can supply oxygen to the stack 403 of oxide semiconductor films. In this embodiment, an oxide insulating film containing nitrogen is used as the insulating film 407.

Next, oxygen is added to the insulating film 407 by an ion implantation method, an ion doping method, a plasma immersion ion implantation method, or the like. The timing of supply of oxygen to the stack 403 of oxide semiconductor films is not particularly limited as long as it is after the formation of the stack 403 of oxide semiconductor films. The step of introducing oxygen may be performed a plurality of times.

After the formation of the insulating film 407, heat treatment is performed. The stack 403 of oxide semiconductor films is damaged by being exposed to plasma at the time of etching or deposition and thus includes oxygen vacancies due to the damage; therefore, the heat treatment for repairing the damage to the oxide semiconductor is performed, whereby oxygen is supplied and thus the oxygen vacancies are reduced. The temperature of the heat treatment is typically higher than or equal to 200° C. and lower than or equal to 450° C. The heat treatment allows nitrogen contained in the oxide insulating film containing nitrogen to be released. Note that the heat treatment can eliminate water, hydrogen, and the like from the oxide insulating film containing nitrogen. In this embodiment, the heat treatment is performed in a mixed atmosphere of nitrogen and oxygen at 350° C. for 1 hour. By the heat treatment, hydrogen atoms and oxygen atoms included in the oxide semiconductor films are bonded in the oxide semiconductor films at an interface between the oxide semiconductor film and the oxide insulating film containing nitrogen, in the oxide insulating film containing nitrogen, or at the surface of the oxide insulating film containing nitrogen to generate water molecules, and the water molecules are desorbed from the oxide insulating film containing nitrogen. In the oxide semiconductor films, portions from which oxygen atoms are desorbed become oxygen vacancies; however, a large number of oxygen atoms which are contained in the oxide insulating film containing nitrogen in excess of that of the stoichiometric composition move to the oxygen vacancies to reduce the oxygen vacancies.

Further, it is preferable that the number of defects be small in the oxide insulating film containing nitrogen used as the insulating film 407, and typically, the spin density of a signal at g=2.001 which is due to dangling bonds of silicon by ESR measurement be lower than or equal to $3\times10^{17}$ spins/cm$^3$. This is because, when defect density in the oxide insulating film containing nitrogen is high, oxygen may be bonded to the defect and the amount of supplied oxygen in the oxide insulating film containing nitrogen is decreased.

In this manner, nitrogen, hydrogen, or water is desorbed from the oxide semiconductor films by the heat treatment after the formation of the insulating film 407, whereby the nitrogen, hydrogen, or water content of the films can be reduced to approximately one tenth.

Next, the protective insulating film 408 is formed over the insulating film 407. An aluminum oxide film or a silicon nitride film is formed as the protective insulating film 408. The protective insulating film 408 has a role in preventing mixing of impurities such as hydrogen and moisture from the outside.

Through the above manufacturing process, the transistor 411 of this embodiment can be formed.

In the transistor described in this embodiment, the second oxide semiconductor film 403*b* which functions as a current path (channel) of the transistor is positioned between the first and third oxide semiconductor films 403*a* and 403*c* which have lower carrier density than the second oxide semiconductor film 403*b*. Accordingly, the channel can be separated from the interface of the insulating film in contact with the stack 403 of oxide semiconductor films, so that a buried channel can be obtained. Further, the second oxide semiconductor film 403*b* can contain as much oxygen as possible; therefore, the number of generated oxygen vacancies is small and thus the reliability of the transistor is improved.

Embodiment 2

In this embodiment, an example which is partly different from Embodiment 1 is described below. The example of this embodiment differs from Embodiment 1 in the way to form the stack 403 of oxide semiconductor films, the way to supply oxygen, and the like.

The steps from formation of the transistor 311 using the first oxide semiconductor material in the lower portion up to formation of the second interlayer insulating film 308, the barrier layer 310, and the third wiring layer 309 are the same as those in Embodiment 1, and thus details of the steps are not described here.

A conductive film is formed over the barrier layer and selectively etched to form the fourth wiring layer 434 and the gate electrode 491.

Then, the insulating film 435 covering the gate electrode 491 is formed and planarized by CMP or the like. As the insulating film 435, an oxide insulating film containing nitrogen is used.

Then, the first gate insulating film 402*a* and the second gate insulating film 402*b* are formed. An oxide insulating film containing nitrogen is used as the first gate insulating film 402*a*.

A 20-nm-thick silicon oxide film may be deposited as the second gate insulating film 402*b* by a plasma CVD method, and after the deposition, the silicon oxide film may be subjected to radical oxidation treatment by microwave plasma treatment for repairing oxygen vacancies.

Figure 17:
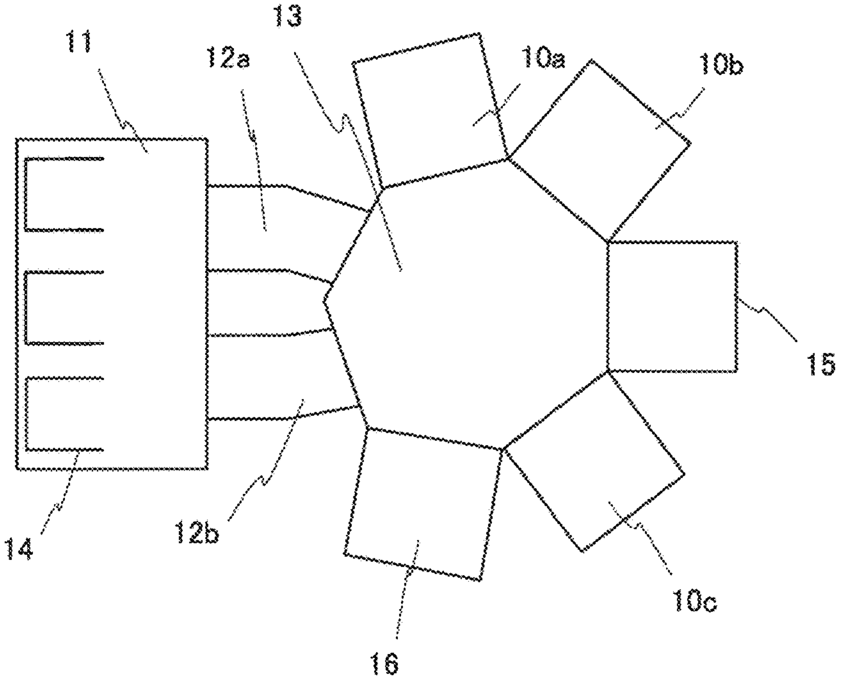
FIG. 17 is a top view illustrating an example of an apparatus for manufacturing a semiconductor device.

Next, with the use of a manufacturing apparatus illustrated in FIG. 17, a stack of oxide semiconductor films is deposited over the second gate insulating film 402*b* without exposure to the air.

The first oxide semiconductor film 403*a*, the second oxide semiconductor film 403*b*, and the third oxide semiconductor film 403*c* are formed.

A deposition temperature of each of the first, second, and third oxide semiconductor films 403*a*, 403*b*, and 403*c* is higher than or equal to room temperature and lower than or equal to 550° C., preferably higher than or equal to 200° C. and lower than 400° C. In order to make the second and third oxide semiconductor films 403*b* and 403*c* CAAC-OS films, the deposition temperature is set to higher than or equal to 200° C. and lower than or equal to 550° C.

Then, selective etching is performed using a mask, so that the island-shaped stack 403 of oxide semiconductor films is formed.

Then, a conductive film is formed over the third oxide semiconductor film 403*c* and processed to form the electrode layer 405*a* and the electrode layer 405*b* (including a wiring formed with the same layer). Then, wet etching is performed using diluted hydrofluoric acid to reduce the thickness of part of the third oxide semiconductor film 403*c*.

Next, an insulating film 407 is formed to cover the electrode layers 405*a* and 405*b* and the stack 403 of oxide semiconductor films which is exposed. The insulating film 407 preferably has a stacked-layer structure. It is preferable that a first oxide insulating film be formed to cover the stack 403 of oxide semiconductor films under a condition which causes little plasma damage in order to reduce plasma damage, and that a second oxide insulating film be stacked thereover under a deposition condition which allows the film to contain a large amount of oxygen.

Oxygen may be added to the insulating film 407 by an ion implantation method, an ion doping method, a plasma immersion ion implantation method, or the like. The timing of supply of oxygen to the stack 403 of oxide semiconductor films is not particularly limited as long as it is after the formation of the stack 403 of oxide semiconductor films. The step of introducing oxygen may be performed a plurality of times.

After formation of the insulating film 407, heat treatment is performed at a temperature higher than or equal to 350° C. and lower than or equal to 450° C. Oxygen contained in the insulating film 435, the first gate insulating film 402*a*, and the second gate insulating film 402*b* is supplied to the stack 403 of oxide semiconductor films. Alternatively, the oxide insulating film containing nitrogen which is described in Embodiment 1 may be used as the insulating film 407 and oxygen contained in the insulating film 407 may be supplied to the stack 403 of oxide semiconductor films.

Next, the protective insulating film 408 is formed over the insulating film 407. An aluminum oxide film or a silicon nitride film is formed as the protective insulating film 408. The protective insulating film 408 has a role in preventing mixing of impurities such as hydrogen and moisture from the outside.

Figure 5:
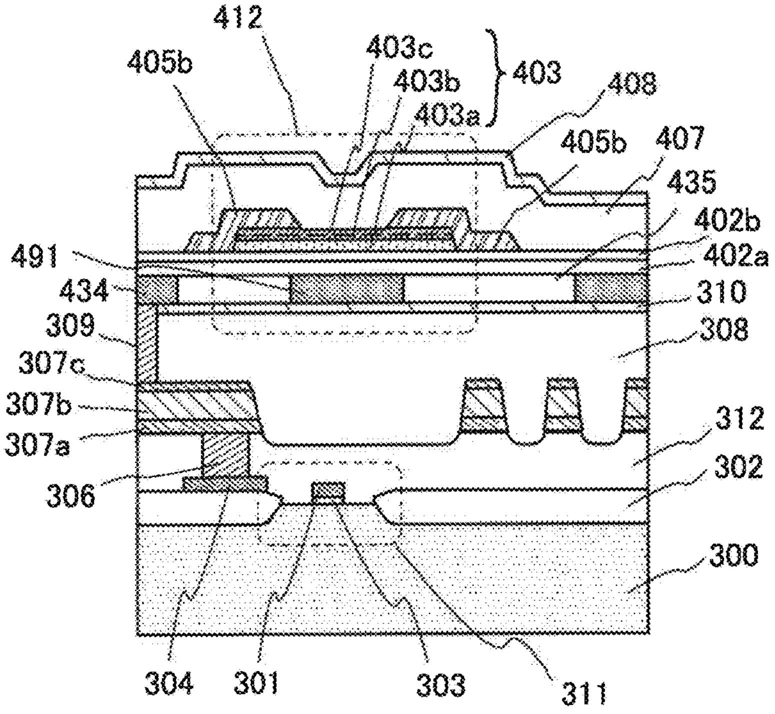
FIG. 5 is a cross-sectional view illustrating one embodiment of the present invention.

Through the above manufacturing process, as illustrated in FIG. 5, a transistor 412 of this embodiment can be formed over the transistor 311.

This embodiment can be freely combined with Embodiment 1.

Embodiment 3

Figure 6A:
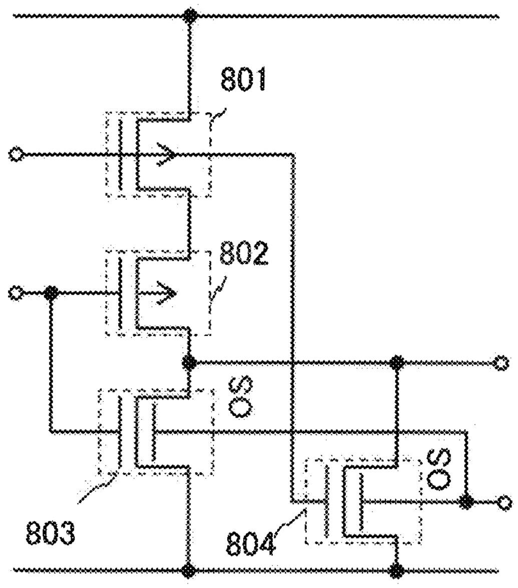
FIGS. 6A and 6B are each a circuit diagram illustrating one embodiment of the present invention.
Figure 6B:
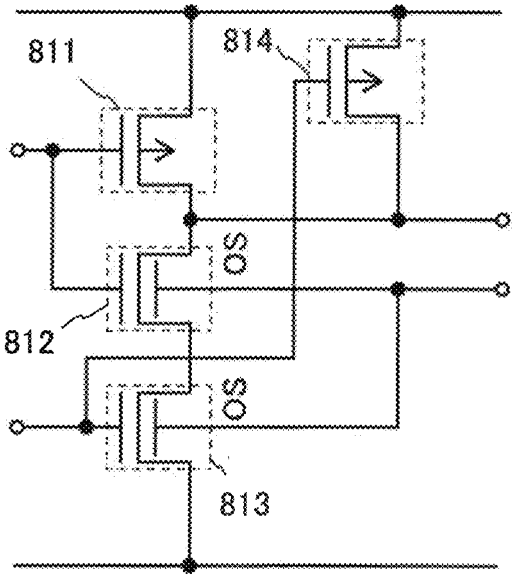

As another example of a semiconductor device including the transistor described in Embodiment 1 or 2, a circuit diagram of a NOR circuit, which is a logic circuit, is illustrated in FIG. 6A. FIG. 6B illustrates a circuit diagram of a NAND circuit.

In the NOR circuit illustrated in FIG. 6A, p-channel transistors 801 and 802 each have a structure similar to that of the transistor 311 in FIG. 4B in that a single crystal silicon substrate is used for a channel formation region, and n-channel transistors 803 and 804 each have a structure similar to that of the transistor 411 in FIG. 4B and that of the transistor 412 in FIG. 5 in that an oxide semiconductor film is used for a channel formation region.

In the NOR circuit in FIG. 6A, conductive layers controlling electrical characteristics of the transistors may be provided to overlap with gate electrode layers with oxide semiconductor films provided therebetween in the transistors 803 and 804. By controlling the potential of the conductive layer to GND, for example, the threshold voltages of the transistors 803 and 804 are increased, so that the transistors can be normally off.

In the NAND circuit in FIG. 6B, p-channel transistors 811 and 814 each have a structure similar to that of the transistor 311 in FIG. 4B, and n-channel transistors 812 and 813 each have a structure similar to that of the transistor 411 in FIG. 4B and that of the transistor 412 in FIG. 5 in that an oxide semiconductor film is used for a channel formation region.

In the NAND circuit illustrated in FIG. 6B, conductive layers controlling electrical characteristics of the transistors are provided to overlap with gate electrode layers with oxide semiconductor films provided therebetween in the transistors 812, and 813. By controlling the potential of the conductive layer to GND, for example, the threshold voltages of the transistors 812 and 813 are increased, so that the transistors can be normally off.

By applying a transistor including an oxide semiconductor for a channel formation region and having extremely small off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

The NOR circuit and the NAND circuit including the transistors described in Embodiment 2 are described as examples in this embodiment; however, one embodiment of the present invention is not limited to the circuits, and an AND circuit, an OR circuit, or the like can be formed using the transistors described in Embodiment 1 or 2. For example, a semiconductor device (storage device) in which stored data can be held even when power is not supplied and which has an unlimited number of times of writing with the transistors described in Embodiment 1 or 2 can be manufactured.

Embodiment 4

In this embodiment, a central processing unit (CPU) at least part of which includes one of the transistor 411 in FIG. 4B and the transistor 412 in FIG. 5 is described as an example of a semiconductor device.

Figure 7A:
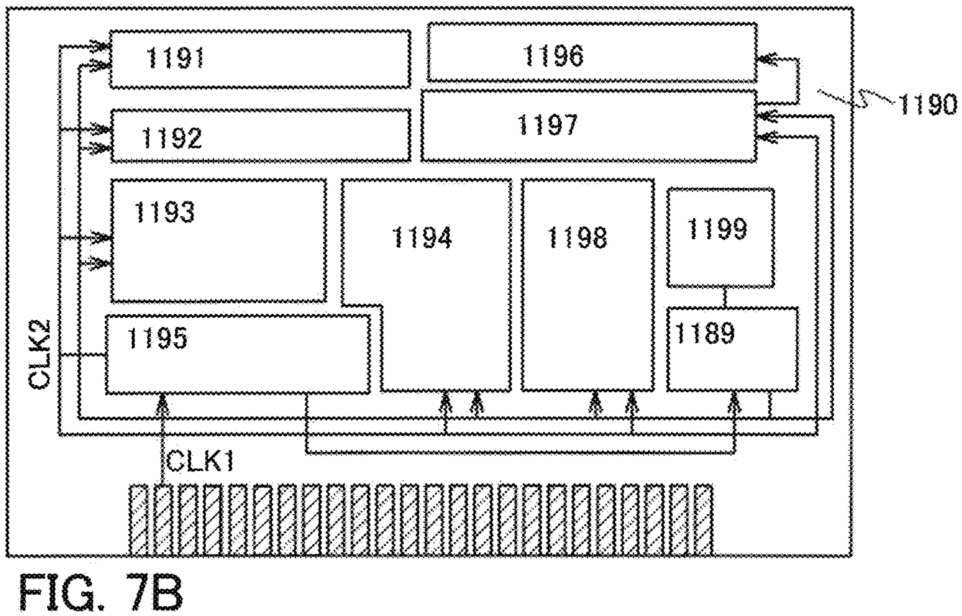
FIGS. 7A to 7C are block diagrams illustrating embodiments of the present invention.

FIG. 7A is a block diagram illustrating a specific structure of a CPU. The CPU illustrated in FIG. 7A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 7A is only an example in which the structure is simplified, and an actual CPU has various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 7A, a memory cell is provided in the register 1196.

In the CPU illustrated in FIG. 7A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 7B:
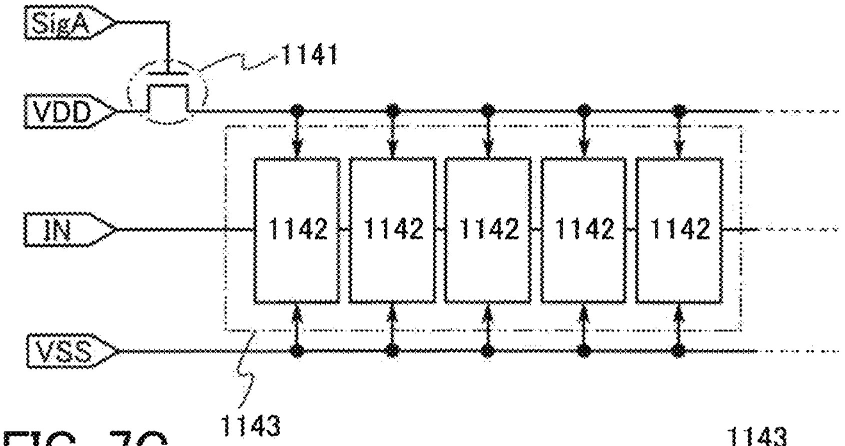
Figure 7C:
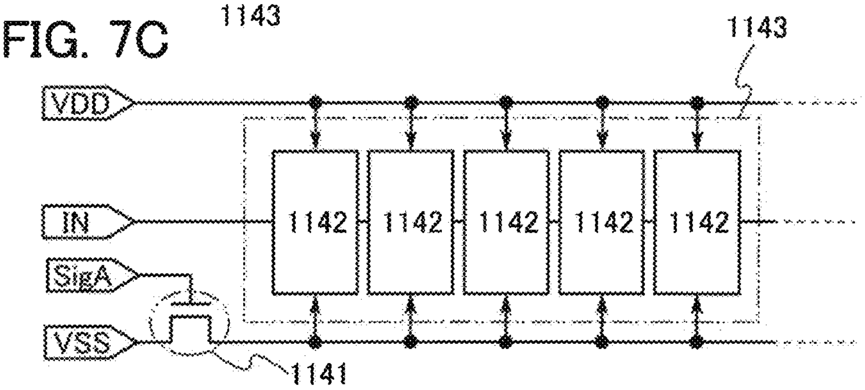

The power supply can be stopped by providing a switching element between a memory cell group and a node to which a power supply potential VDD or a power supply potential VSS is supplied, as illustrated in FIG. 7B or FIG. 7C. Circuits illustrated in FIGS. 7B and 7C are described below.

FIGS. 7B and 7C each illustrate an example of a memory circuit configuration in which one of the transistor 411 in FIG. 4B and the transistor 412 in FIG. 5 is used as a switching element which controls supply of a power supply potential to a memory cell.

The memory device illustrated in FIG. 7B includes a switching element 1141 and a memory cell group 1143 including a plurality of memory cells 1142. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 7B, one of the transistor 411 in FIG. 4B and the transistor 412 in FIG. 5 is used as the switching element 1141, and the switching of the transistor is controlled by a signal Sig A supplied to a gate electrode thereof.

Note that FIG. 7B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 7B, the switching element 1141 may control the supply of the low-level power supply potential VSS.

In FIG. 7C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The methods and structures described in this embodiment can be combined as appropriate with any of the methods and structures described in the other embodiments.

Embodiment 5

In this embodiment, a semiconductor device that is one embodiment of the present invention is described using a liquid crystal display device as an example.

Figure 8A:
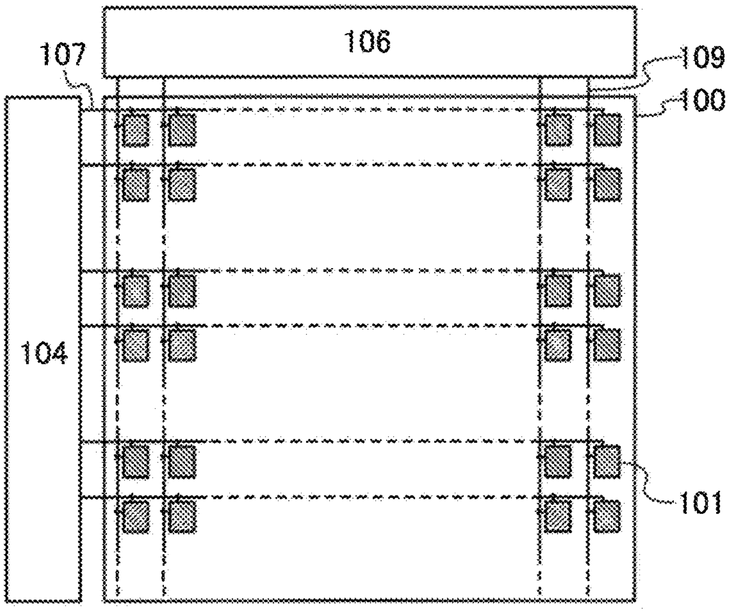
FIGS. 8A to 8C are a diagram illustrating a display device of one embodiment of the present invention and circuit diagrams illustrating pixels.

FIG. 8A illustrates a structural example of a semiconductor device. The semiconductor device in FIG. 8A includes a pixel portion 100, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 100 includes a plurality of pixels 101 arranged in a matrix. Furthermore, capacitor lines 115 arranged in parallel or substantially in parallel are provided along the scan lines 107. Note that the capacitor lines 115 may be arranged in parallel or substantially in parallel along the signal lines 109.

Each scan line 107 is electrically connected to the n pixels 101 in the corresponding row among the pixels 101 arranged in m rows and n columns in the pixel portion 100. Each signal line 109 is electrically connected to them pixels 101 in the corresponding column among the pixels 101 arranged in m rows and n columns. Note that m and n are each an integer of 1 or more. Each capacitor line 115 is electrically connected to the n pixels 101 in the corresponding row among the pixels 101 arranged in m rows and n columns. Note that in the case where the capacitor lines 115 are arranged in parallel or substantially in parallel along the signal lines 109, each capacitor line 115 is electrically connected to the m pixels 101 in the corresponding column among the pixels 101 arranged in m rows and n columns.

Figure 8B:
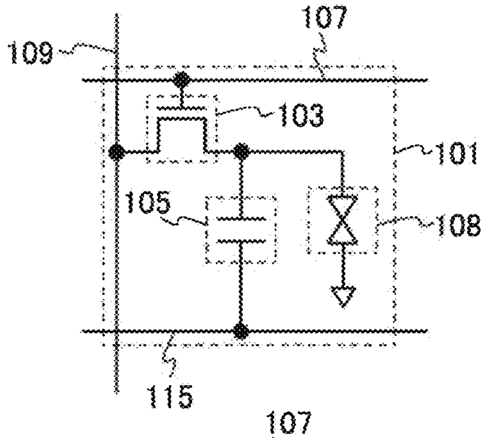

FIG. 8B is an example of a circuit diagram of the pixel 101 included in the semiconductor device illustrated in FIG. 8A. The pixel 101 in FIG. 8B includes a transistor 103 a gate electrode of which is electrically connected to the scan line 107 and a source electrode of which is electrically connected to the signal line 109, a capacitor 105 one electrode of which is electrically connected to a drain electrode of the transistor 103 and the other electrode of which is electrically connected to the capacitor line 115 which supplies a constant potential, and a liquid crystal element 108. A pixel electrode of the liquid crystal element 108 is electrically connected to the drain electrode of the transistor 103 and the one electrode of the capacitor 105, and an electrode (counter electrode) facing the pixel electrode is electrically connected to a wiring which supplies a counter potential.

The liquid crystal element 108 is an element which controls transmission of light by an optical modulation action of liquid crystal which is positioned between a substrate provided with the transistor 103 and the pixel electrode and a substrate provided with the counter electrode. The optical modulation action of liquid crystal is controlled by an electric field applied to the liquid crystal (including a horizontal electric field, a vertical electric field, and a diagonal electric field).

Figure 9:
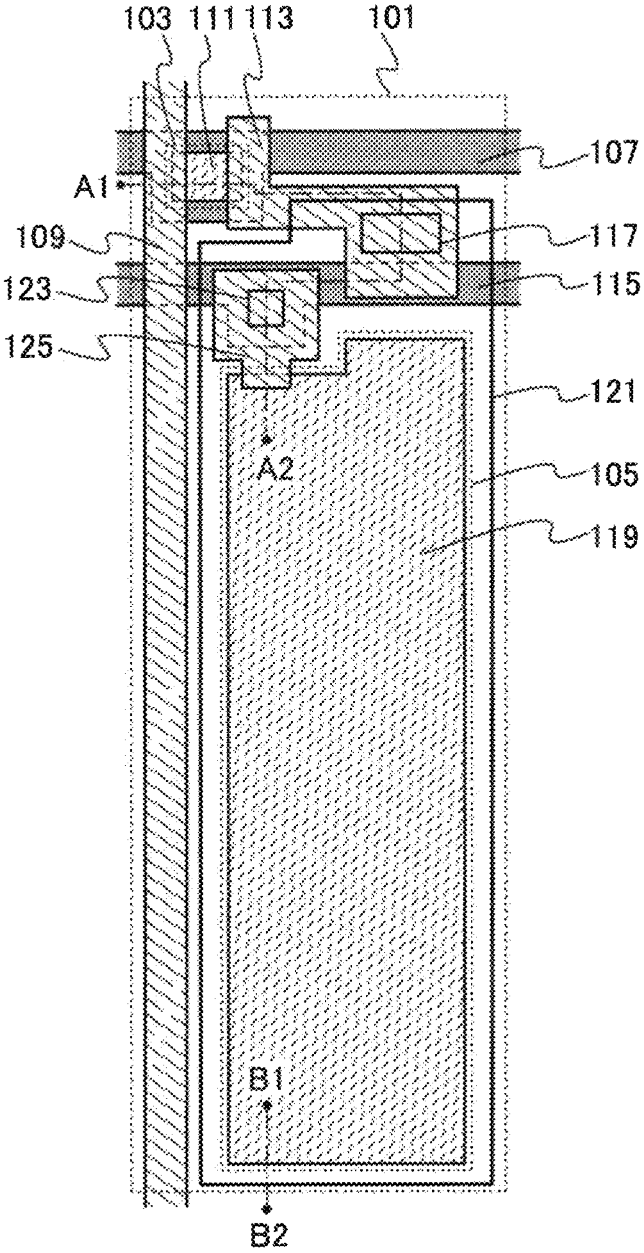
FIG. 9 is a top view illustrating a display device.

Next, a specific structural example of the pixel 101 of the liquid crystal display device will be described. FIG. 9 is a top view of the pixel 101. Note that in FIG. 9, the counter electrode and the liquid crystal element are omitted.

In FIG. 9, the scan line 107 is provided so as to extend in the direction perpendicular or substantially perpendicular to the signal line 109 (in the horizontal direction in FIG. 9). The signal line 109 is provided so as to extend in the direction perpendicular or substantially perpendicular to the scan line 107 (in the vertical direction in FIG. 9). The capacitor line 115 is provided so as to extend in the direction parallel with the scan line 107. The scan line 107 and the capacitor line 115 are electrically connected to the scan line driver circuit 104 (see FIG. 8A), and the signal line 109 is electrically connected to the signal line driver circuit 106 (see FIG. 8A).

The transistor 103 is provided in a region where the scan line 107 and the signal line 109 cross each other. The transistor 103 includes at least a stack 111 of oxide semiconductor films including a channel formation region, a gate electrode, a gate insulating film (not illustrated in FIG. 9), a source electrode, and a drain electrode.

Figure 10:
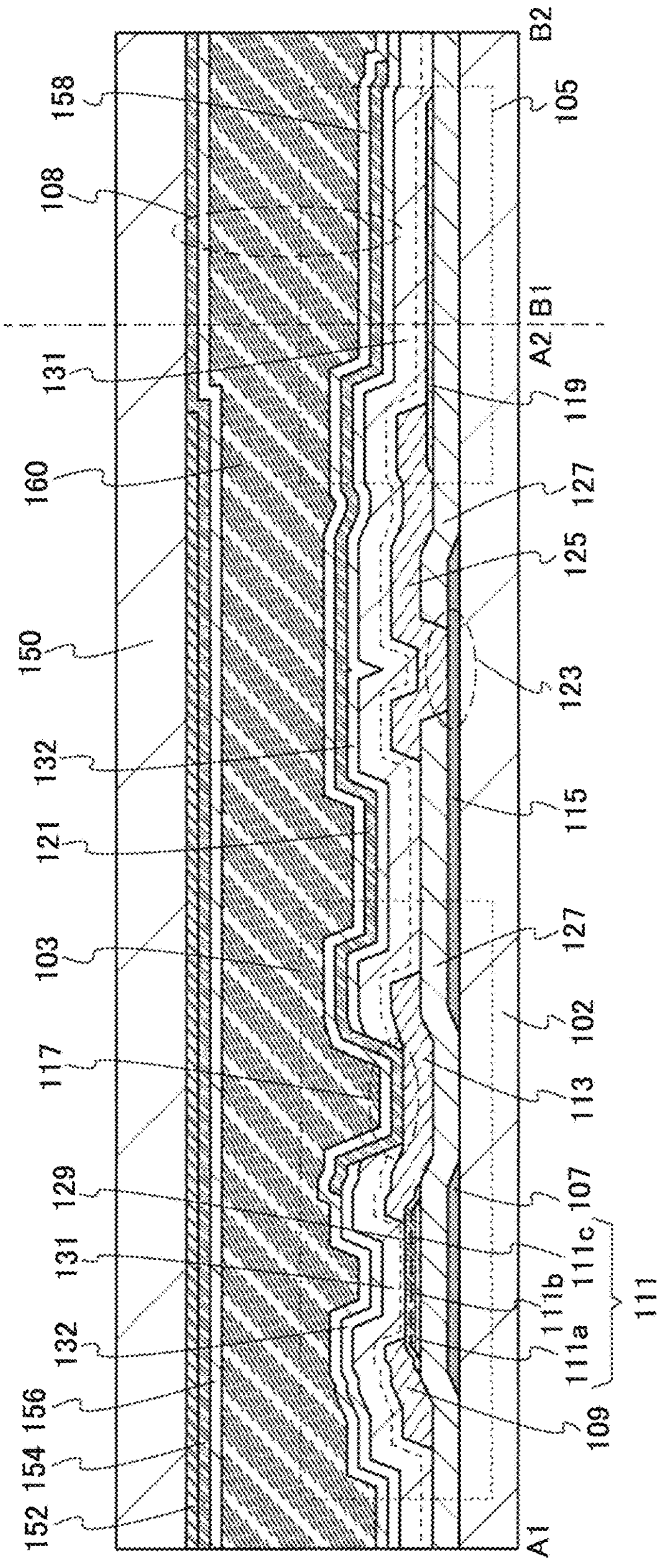
FIG. 10 is a cross-sectional view illustrating a display device.

In the stack 111 of the oxide semiconductor films, as illustrated in FIG. 10, a first oxide semiconductor film 111*a*, a second oxide semiconductor film 111*b*, and a third oxide semiconductor film 111*c* are stacked in this order. Materials of the first to third oxide semiconductor films 111*a*, 111*b*, and 111*c* are selected as appropriate so that a well-shaped structure in which the bottom of the conduction band in the second oxide semiconductor film 111*b* is deeper than the bottoms of the conduction band in the first and third oxide semiconductor films 111*a* and 111*c* is obtained. In this embodiment, the first and third oxide semiconductor films 111*a* and 111*c* are formed using a target having an atomic ratio of In:Ga:Zn=1:3:2, and the second oxide semiconductor film 111*b* is formed using a target having an atomic ratio of In:Ga:Zn=1:1:1. The stack 111 of oxide semiconductor films enables formation of a buried channel and a reduction in oxygen vacancies, thereby improving the reliability of the transistor 103.

Further, when the stack 111 of oxide semiconductor films is deposited or subjected to heat treatment under an appropriate condition, the off-state current of the transistor can be significantly reduced; therefore, the power consumption of the semiconductor device can be reduced.

The scan line 107 also functions as a gate electrode of the transistor 103, and the signal line 109 also functions as a source electrode of the transistor 103. A conductive film 113 functions as a drain electrode of the transistor 103 and is electrically connected to a pixel electrode 121 through an opening 117. Note that pixel electrode 121 is illustrated without hatching in FIG. 9. Further, the scan line 107 is represented as it is even when it indicates the gate electrode of the transistor, and the signal line 109 is represented as it is even when it indicates the source electrode of the transistor.

The capacitor 105 is provided in a region which is in the pixel 101 and surrounded by the capacitor lines 115 and the signal lines 109. The capacitor 105 is electrically connected to the capacitor line 115 through a conductive film 125 provided in and over an opening 123. The capacitor 105 includes an oxide semiconductor film 119, the pixel electrode 121, and an insulating film (not illustrated in FIG. 9) which is formed as a dielectric film over the transistor 103. The oxide semiconductor film 119, the pixel electrode 121, and the dielectric film transmit light; accordingly, the capacitor 105 transmits light.

Thanks to the light-transmitting property of the oxide semiconductor film 119, the capacitor 105 can be formed large (in a large area) in the pixel 101. For this reason, the semiconductor device can have charge capacity increased while the aperture ratio is not reduced or is improved. Further, by improving the aperture ratio, a semiconductor device having high display quality can be obtained.

Here, the characteristics of a transistor including an oxide semiconductor will be described. The transistor including an oxide semiconductor is an n-channel transistor. Further, oxygen vacancies in the oxide semiconductor might generate carriers, which might degrade the electrical characteristics and reliability of the transistor. For example, in some cases, the threshold voltage of the transistor is shifted in the negative direction, and drain current flows when the gate voltage is 0 V. The characteristics of a transistor in which drain current flows when the gate voltage is 0 V are referred to as normally-on characteristics, whereas the characteristics of a transistor in which substantially no drain current flows when the gate voltage is 0 V are referred to as normally-off characteristics.

It is preferable that defects in the stack 111 of oxide semiconductor films, typically, oxygen vacancies be reduced as much as possible. For example, it is preferable that the spin density of the stack 111 of oxide semiconductor films (the density of defects in the oxide semiconductor films) at a g-value of 1.93 in electron spin resonance spectroscopy in which a magnetic field is applied in parallel with the film surface be reduced to lower than or equal to the lower detection limit of measurement equipment. When the defects typified by oxygen vacancies in the oxide semiconductor films are reduced as much as possible, the transistor 103 can be prevented from being normally on, leading to improvements in the electrical characteristics and reliability of a semiconductor device.

It is preferable that impurities (e.g., hydrogen, moisture, and elements belonging to Group 14) contained in the stack 111 of oxide semiconductor films be reduced as much as possible, and when the oxide semiconductor films are highly purified to be i-type oxide semiconductor films, the transistor 103 can be prevented from being normally on; as a result, the off-state current of the transistor 103 can be significantly reduced. Therefore, a semiconductor device having favorable electrical characteristics can be manufactured. Further, a highly reliable semiconductor device can be manufactured.

Next, FIG. 10 is a cross-sectional view taken along dashed-dotted lines A1-A2 and B1-B2 in FIG. 9.

A cross-sectional structure of the pixel 101 of the liquid crystal display device is as follows. The liquid crystal display device includes an element portion over a substrate 102, an element portion over a substrate 150, and a liquid crystal layer sandwiched between the two element portions.

First, the structure of the element portion formed over the substrate 102 is described. The scan line 107 functioning as the gate electrode of the transistor 103 and the capacitor line 115 over the same surface as the scan line 107 are provided over the substrate 102. A gate insulating film 127 is provided over the scan line 107 and the capacitor line 115. The stack 111 of oxide semiconductor films is provided over a portion of the gate insulating film 127 which overlaps with the scan line 107, and the oxide semiconductor film 119 is provided over the gate insulating film 127. The signal line 109 functioning as the source electrode of the transistor 103 and the conductive film 113 functioning as the drain electrode of the transistor 103 are provided over the stack 111 of oxide semiconductor films and the gate insulating film 127. An opening 123 reaching the capacitor line 115 is formed in the gate insulating film 127, and the conductive film 125 is provided over the opening 123, the gate insulating film 127, and the oxide semiconductor film 119. An insulating film 129, an insulating film 131, and an insulating film 132 functioning as protective insulating films of the transistor 103 are provided over the gate insulating film 127, the signal line 109, the stack 111 of oxide semiconductor films, the conductive film 113, the conductive film 125, and the oxide semiconductor film 119. The opening 117 reaching the conductive film 113 is formed in the insulating film 129, the insulating film 131, and the insulating film 132, and the pixel electrode 121 is provided over the opening 117 and the insulating film 132. An insulating film 158 functioning as an alignment film is provided over the pixel electrode 121 and the insulating film 132. Note that a base insulating film may be provided between the substrate 102, and the scan line 107, the capacitor line 115, and the gate insulating film 127.

In the capacitor 105 of this structure, the oxide semiconductor film 119 formed in the same step as the third oxide semiconductor film 111*c* serves as one of a pair of electrodes, the pixel electrode 121 serves as the other of the pair of electrodes, and the insulating film 129, the insulating film 131, and the insulating film 132 serve as dielectric films provided between the pair of electrodes.

The details of the components of the above structure are described below.

Although there is no particular limitation on a material and the like of the substrate 102, it is necessary that the substrate have heat resistance high enough to withstand at least heat treatment performed in a manufacturing process of a semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. As the substrate 102, a quartz substrate, a sapphire substrate, or the like can be used.

The scan line 107 and the capacitor line 115 are formed to have a single-layer structure or a stacked-layer structure using any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan line 107 and the capacitor line 115 are a single-layer structure using aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which copper is stacked over Cu—Mg—Al alloy, and a three-layer structure in which titanium nitride, copper, and tungsten are stacked in this order.

As a material of the scan line 107 and the capacitor line 115, a light-transmitting conductive material which can be used for the pixel electrode 121 can be used.

The scan line 107 and the capacitor line 115 are preferably formed using aluminum or copper, which are low resistance materials. With the use of aluminum or copper, signal delay is reduced, so that higher image quality can be achieved. Note that aluminum has low heat resistance, and thus a defect due to hillocks, whiskers, or migration is easily generated. To prevent migration of aluminum, a layer of a metal material having a higher melting point than aluminum, such as molybdenum, titanium, or tungsten, is preferably stacked over an aluminum layer. Also in the case where copper is used, in order to prevent a defect due to migration and diffusion of copper elements, a layer of a metal material having a higher melting point than copper, such as molybdenum, titanium, or tungsten, is preferably stacked over a copper layer.

The gate insulating film 127 is formed to have a single-layer structure or a stacked-layer structure using, for example, any of insulating materials such as silicon oxide, silicon oxynitride, silicon nitride oxide, silicon nitride, aluminum oxide, hafnium oxide, gallium oxide, and a Ga—Zn-based metal oxide. In order to improve the characteristics of the interface between the gate insulating film 127 and the stack 111 of oxide semiconductor films, a region in the gate insulating film 127 which is in contact with at least the stack 111 of oxide semiconductor films is preferably formed using an oxide insulating film.

Further, it is possible to prevent outward diffusion of oxygen from the stack 111 of oxide semiconductor films and entry of hydrogen, water, or the like into the stack 111 of oxide semiconductor films from the outside by providing an insulating film having a barrier property against oxygen, hydrogen, water, and the like as the gate insulating film 127. Examples of the insulating film having a barrier property against oxygen, hydrogen, water, and the like are an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film.

The gate insulating film 127 may be formed using a high-k material such as hafnium silicate ($HfSiO_x$), hafnium silicate containing nitrogen ($HfSi_xO_yN_z$), hafnium aluminate containing nitrogen ($HfAl_xO_yN_z$), hafnium oxide, or yttrium oxide, in which case gate leakage current of the transistor 103 can be reduced.

The gate insulating film 127 preferably has the following stacked-layer structure. It is preferable that a silicon nitride film having fewer defects be provided as a first silicon nitride film, a silicon nitride film from which less hydrogen and ammonia are released be provided as a second silicon nitride film over the first silicon nitride film, and any of the oxide insulating films listed as those used for the gate insulating film 127 be provided over the second silicon nitride film.

As the second silicon nitride film, a nitride insulating film which releases hydrogen molecules less than $5\times10^{21}$ molecules/cm$^3$, preferably less than or equal to $3\times10^{21}$ molecules/cm$^3$, more preferably less than or equal to $1\times10^{21}$ molecules/cm$^3$, and ammonia molecules less than $1\times10^{22}$ molecules/cm$^3$, preferably less than or equal to $5\times10^{21}$ molecules/cm$^3$, more preferably less than or equal to $1\times10^{21}$ molecules/cm$^3$ by thermal desorption spectroscopy is preferably used. The first silicon nitride film and the second silicon nitride film are used as part of the gate insulating film 127, whereby a gate insulating film which has fewer defects and from which less hydrogen and ammonia are released can be formed as the gate insulating film 127. Thus, the amount of hydrogen and nitrogen contained in the gate insulating film 127 which enter the stack 111 of oxide semiconductor films can be reduced.

In the case where the trap level (also referred to as interface level) is present at the interface between the stack 111 of oxide semiconductor films and the gate insulating film or in the gate insulating film in the transistor including an oxide semiconductor, a shift of the threshold voltage of the transistor, typically, a shift of the threshold voltage in the negative direction, and an increase in the subthreshold swing (S value) showing a gate voltage needed for changing the drain current by an order of magnitude when the transistor is turned on are caused. As a result, there is a problem in that electrical characteristics vary among transistors. Therefore, the use of a silicon nitride film having fewer defects as a gate insulating film and provision of an oxide insulating film in contact with the first oxide semiconductor film 111*a* can reduce a shift of the threshold voltage in the negative direction and minimize an increase in S value.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

In this embodiment, the first oxide semiconductor film 111*a* is a film with a low degree of crystallinity, and the second and third oxide semiconductor films 111*b* and 111*c* have a crystalline structure with a high degree of crystallinity. After a film with a low degree of crystallinity is formed as the first oxide semiconductor film 111*a* and the second oxide semiconductor film 111*b* is deposited, patterning and heat treatment (at a temperature higher than or equal to 200° C. and lower than or equal to 550° C.) are performed, and then the third oxide semiconductor film 111*c* and the oxide semiconductor film 119 are formed. Note that the third oxide semiconductor film 111*c* can be an oxide semiconductor film having a crystalline structure depending on the deposition condition even when the heat treatment after patterning is not performed. Note that part of the third oxide semiconductor film 111*c*, i.e., a region which is in contact with the gate insulating film and does not overlap with the second oxide semiconductor film 111*b* has a low degree of crystallinity. The oxide semiconductor film 119 which is formed in the same step as the third oxide semiconductor film 111*c* is a film with a low degree of crystallinity. In the case where the second oxide semiconductor film 111*b* is formed using a target having an atomic ratio of In:Ga:Zn=1:3:2 and the third oxide semiconductor film 111*c* and the oxide semiconductor film 119 are formed using a target having an atomic ratio of In:Ga:Zn=1:1:1, the part of the third oxide semiconductor film 111*c*, i.e., the region which is in contact with the gate insulating film and does not overlap with the second oxide semiconductor film 111*b* can also have a high degree of crystallinity and the oxide semiconductor film 119 can also have a high degree of crystallinity. The thickness of the stack 111 of oxide semiconductor films is greater than or equal to 1 nm and less than or equal to 100 nm, preferably greater than or equal to 1 nm and less than or equal to 50 nm, further preferably greater than or equal to 3 nm and less than or equal to 20 nm.

When the buried channel is formed in the transistor 103, few oxygen vacancies are generated and the reliability of the transistor is improved.

An oxide semiconductor which can be used for the stack 111 of oxide semiconductor films and the oxide semiconductor film 119 has an energy gap of greater than or equal to 2 eV, preferably greater than or equal to 2.5 eV, more preferably greater than or equal to 3 eV. The use of such an oxide semiconductor having a wide energy gap can reduce the off-state current of the transistor 103.

The signal line 109 functioning as the source electrode of the transistor 103, the conductive film 113 functioning as the drain electrode of the transistor 103, and the conductive film 125 electrically connecting the oxide semiconductor film 119 and the capacitor line 115 in the capacitor 105 are formed to have a single-layer structure or a stacked-layer structure using a material which can be used for the scan line 107 and the capacitor line 115.

The insulating films 129, 131, and 132 functioning as the protective insulating films of the transistor 103 and the dielectric films in the capacitor 105 are insulating films each formed using a material which can be used for the gate insulating film 127. It is particularly preferable that the insulating films 129 and 131 be oxide insulating films and the insulating film 132 be a nitride insulating film. Further the use of a nitride insulating film as the insulating film 132 can suppress entry of impurities such as hydrogen and water into the transistor 103 (in particular, the second oxide semiconductor film 111*b*) from the outside. Note that the insulating film 129 is not necessarily provided.

Further, an oxide insulating film in which the oxygen content is higher than that in the stoichiometric composition is preferably used as one of or both the insulating film 129 and the insulating film 131. In that case, oxygen can be prevented from being released from the oxide semiconductor film, and the oxygen contained in an oxygen excess region can enter the oxide semiconductor film to reduce oxygen vacancies. For example, when an oxide insulating film having the following feature is used, oxygen vacancies in the oxide semiconductor film can be reduced. The feature of the oxide insulating film is that the number of oxygen molecules released from the oxide insulating film is greater than or equal to $1.0\times10^{18}$ molecules/cm$^3$ when measured by thermal desorption spectroscopy (hereinafter referred to as TDS spectroscopy). Note that an oxide insulating film partly including a region in which the oxygen content is higher than that in the stoichiometric composition (oxygen excess region) may be used as one of or both the insulating film 129 and the insulating film 131. When such an oxygen excess region is present in a region overlapping with at least the stack 111 of semiconductor films, oxygen is prevented from being released from the oxide semiconductor film and the oxygen contained in the oxygen excess region can enter the oxide semiconductor film to reduce oxygen vacancies.

In the case where the insulating film 131 is an oxide insulating film in which the oxygen content is higher than that in the stoichiometric composition, the insulating film 129 is preferably an oxide insulating film through which oxygen penetrates. Oxygen which enters the insulating film 129 from the outside does not completely penetrate through the insulating film 129 to be released and part thereof remains in the insulating film 129. Further, there is oxygen which is contained in the insulating film 129 from the first and is released from the insulating film 129 to the outside. Thus, the insulating film 129 preferably has a high coefficient of diffusion of oxygen.

Since the insulating film 129 is in contact with the third oxide semiconductor film 111*c*, the insulating film 129 is preferably an oxide insulating film through which oxygen penetrates and which has a low interface state with the third oxide semiconductor film 111*c*. For example, the insulating film 129 is preferably an oxide insulating film having a lower defect density than the insulating film 131. Specifically, the spin density of the oxide insulating film at a g-value of 2.001 (E'-center) measured by electron spin resonance spectroscopy is lower than or equal to $3.0\times10^{17}$ spins/$cm^3$, preferably lower than or equal to $5.0\times10^{16}$ spins/$cm^3$. The spin density at a g-value of 2.001 measured by electron spin resonance spectroscopy corresponds to the number of dangling bonds in the insulating film 129.

The insulating film 129 can have a thickness of greater than or equal to 5 nm and less than or equal to 150 nm, preferably greater than or equal to 5 nm and less than or equal to 50 nm, more preferably greater than or equal to 10 nm and less than or equal to 30 nm. The insulating film 131 can have a thickness of greater than or equal to 30 nm and less than or equal to 500 nm, preferably greater than or equal to 150 nm and less than or equal to 400 nm.

In the case where a nitride insulating film is used as the insulating film 132, an insulating film having a barrier property against nitrogen is preferably used as one of or both the insulating film 129 and the insulating film 131. For example, a dense oxide insulating film has a barrier property against nitrogen. Specifically, an oxide insulating film which can be etched at a rate of less than or equal to 10 nm per minute when the temperature is 25° C. and 0.5 wt % of fluoric acid is used is preferably used.

In the case where an oxide insulating film containing nitrogen, such as a silicon oxynitride film or a silicon nitride oxide film, is used as one of or both the insulating film 129 and the insulating film 131, the nitrogen concentration measured by SIMS is greater than or equal to the lower limit of measurement by SIMS and less than $3\times10^{20}$ atoms/$cm^3$, preferably greater than or equal to $1\times10^{18}$ atoms/$cm^3$ and less than or equal to $1\times10^{20}$ atoms/$cm^3$. In that case, the amount of nitrogen which enters the stack 111 of oxide semiconductor films included in the transistor 103 can be reduced and the number of defects in the nitrogen-containing oxide insulating film itself can be reduced.

As the insulating film 132, a nitride insulating film where the hydrogen content is low may be provided. The nitride insulating film is as follows, for example: the number of hydrogen molecules released from the nitride insulating film is less than $5.0\times10^{21}$ molecules/$cm^3$, preferably less than $3.0\times10^{21}$ molecules/$cm^3$, more preferably less than $1.0\times10^{21}$ molecules/$cm^3$ when measured by TDS spectroscopy.

The insulating film 132 has a thickness large enough to prevent entry of impurities such as hydrogen and water from the outside. For example, the thickness can be greater than or equal to 50 nm and less than or equal to 200 nm, preferably greater than or equal to 50 nm and less than or equal to 150 nm, more preferably greater than or equal to 50 nm and less than or equal to 100 nm.

The pixel electrode 121 can be provided using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Further, the scan line driver circuit 104 and the signal line driver circuit 106 illustrated in FIG. 8A can be formed over the same substrate. In the case where a transistor including an oxide semiconductor film is formed as a transistor which is provided in the scan line driver circuit 104 or the signal line driver circuit 106, an electrode functioning as a back gate may be formed over the oxide semiconductor film in the same step as formation of the pixel electrode 121. When the electrode functioning as a back gate is provided over the transistor in the scan line driver circuit 104 or the signal line driver circuit 106 to overlap with the transistor, the reliability of the transistor can be improved.

Next, the structure of the element portion provided over the substrate 150 is described. A light-blocking film 152 is provided over the substrate 150, an electrode (a counter electrode 154) is provided over the light-blocking film 152 so as to face the pixel electrode 121, and an insulating film 156 which functions as an alignment film is provided over the counter electrode 154.

The light-blocking film 152 prevents the transistor 103 from being irradiated with backlight or light from the outside. The light-blocking film 152 can be formed using a material such as a metal or an organic resin including a pigment and may be provided in a region outside the pixel portion 100, such as over the scan line driver circuit 104 and over the signal line driver circuit 106 (see FIGS. 8A to 8C), as well as over the transistor 103 in the pixel 101.

Note that a coloring film which transmits light with a predetermined wavelength may be provided between the light-blocking films 152 adjacent to each other. Further, an overcoat film may be provided between the counter electrode 154, and the light-blocking films 152 and the coloring film.

The counter electrode 154 is formed using any of the light-transmitting conductive materials given as those used for the pixel electrode 121 as appropriate.

The liquid crystal element 108 includes the pixel electrode 121, the counter electrode 154, and a liquid crystal layer 160. The liquid crystal layer 160 is sandwiched between the insulating film 158 which is provided in the element portion over the substrate 102 and functions as an alignment film and the insulating film 156 which is provided in the element portion over the substrate 150 and functions as an alignment film. Further, the pixel electrode 121 overlaps with the counter electrode 154 with the liquid crystal layer 160 interposed therebetween.

Here, connection of the components included in the pixel 101 described in this embodiment is described with reference to the circuit diagram in FIG. 8C and the cross-sectional view in FIG. 10.

Figure 8C:
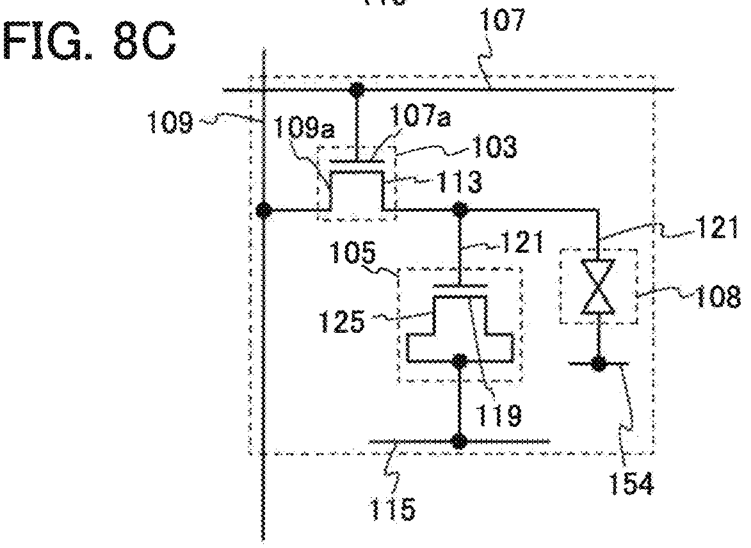

FIG. 8C is an example of a detailed circuit diagram of the pixel 101 included in the semiconductor device illustrated in FIG. 8A. As illustrated in FIG. 8C and FIG. 10, the transistor 103 includes the scan line 107 including the gate electrode 107*a*, the signal line 109 including the source electrode 109*a*, and the conductive film 113 including the drain electrode 113*a*.

In the capacitor 105, the oxide semiconductor film 119 connected to the capacitor line 115 through the conductive film 125 functions as one electrode; the pixel electrode 121 connected to the conductive film 113 including the drain electrode 113*a* functions as the other electrode; and the insulating films 129, 131, and 132 provided between the oxide semiconductor film 119 and the pixel electrode 121 function as dielectric films.

The liquid crystal element 108 includes the pixel electrode 121, the counter electrode 154, and the liquid crystal layer 160 provided between the pixel electrode 121 and the counter electrode 154.

Despite having a structure which is the same as that of the third oxide semiconductor film 111*c*, the oxide semiconductor film 119 in the capacitor 105 functions as the electrode of the capacitor 105. This is because the pixel electrode 121 can function as a gate electrode, the insulating films 129, 131, and 132 can function as gate insulating films, and the capacitor line 115 can function as a source electrode or a drain electrode, so that the capacitor 105 can be operated in a manner similar to that of a transistor and the oxide semiconductor film 119 can be made to be in a conductive state. In other words, the capacitor 105 can serve as a MOS capacitor, the oxide semiconductor film 119 can be made to be in a conductive state so that the oxide semiconductor film 119 can function as one electrode of the capacitor by controlling a potential to be supplied to the capacitor line 115. In this case, the potential to be supplied to the capacitor line 115 is set as follows. The potential of the pixel electrode 121 is changed in the positive direction and the negative direction in order to operate the liquid crystal element 108 (see FIG. 8C). The potential of the capacitor line 115 needs to be constantly lower than the potential to be supplied to the pixel electrode 121 by the threshold voltage of the capacitor 105 (MOS capacitor) or more in order that the capacitor 105 (MOS capacitor) be constantly in a conductive state. In other words, since the oxide semiconductor film 119 has the same structure as the third oxide semiconductor film 111*c*, the potential of the capacitor line 115 should be lower than the potential to be supplied to the pixel electrode 121 by the threshold voltage of the transistor 103 or more. In such a manner, a channel is formed; thus, the capacitor 105 (MOS capacitor) can be made to be in a conductive state constantly.

When an oxide insulating film through which oxygen penetrates and which has fewer interface states between the third oxide semiconductor film 111*c* and the oxide insulating film is used as the insulating film 129 over the stack 111 of oxide semiconductor films and the oxide semiconductor film 119, and an oxide insulating film which includes an oxygen excess region or an oxide insulating film in which the oxygen content is higher than that in the stoichiometric composition is used as the insulating film 131, oxygen can be easily supplied to the stack 111 of oxide semiconductor films, the release of oxygen from the stack 111 of oxide semiconductor films can be prevented, and the oxygen contained in the insulating film 131 can enter the stack 111 of oxide semiconductor films to reduce oxygen vacancies in the stack 111 of oxide semiconductor films. Thus, the transistor 103 can be prevented from being normally on and a potential to be supplied to the capacitor line 115 can be controlled so that the capacitor 105 (MOS capacitor) can be constantly in a conductive state; thus, the semiconductor device can have favorable electrical characteristics and high reliability.

The use of a nitride insulating film as the insulating film 132 over the insulating film 131 can suppress entry of impurities such as hydrogen and water into the stack 111 of oxide semiconductor films and the oxide semiconductor film 119 from the outside. Moreover, the use of a nitride insulating film with a low hydrogen content as the insulating film 132 can minimize variations in electrical characteristics of the transistor 103 and the capacitor 105 (MOS capacitor).

Further, the capacitor 105 can be formed large (in a large area) in the pixel 101. Therefore, a semiconductor device in which the aperture ratio is not reduced or is improved and the charge capacitance is increased can be obtained. Further, with the increased aperture ratio, the semiconductor device can have favorable display quality.

Embodiment 6

A semiconductor device disclosed in this specification can be applied to a variety of electronic appliances (including game machines). A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic appliances are shown in FIGS. 14A to 14C and FIGS. 15A to 15C.

Figure 14A:
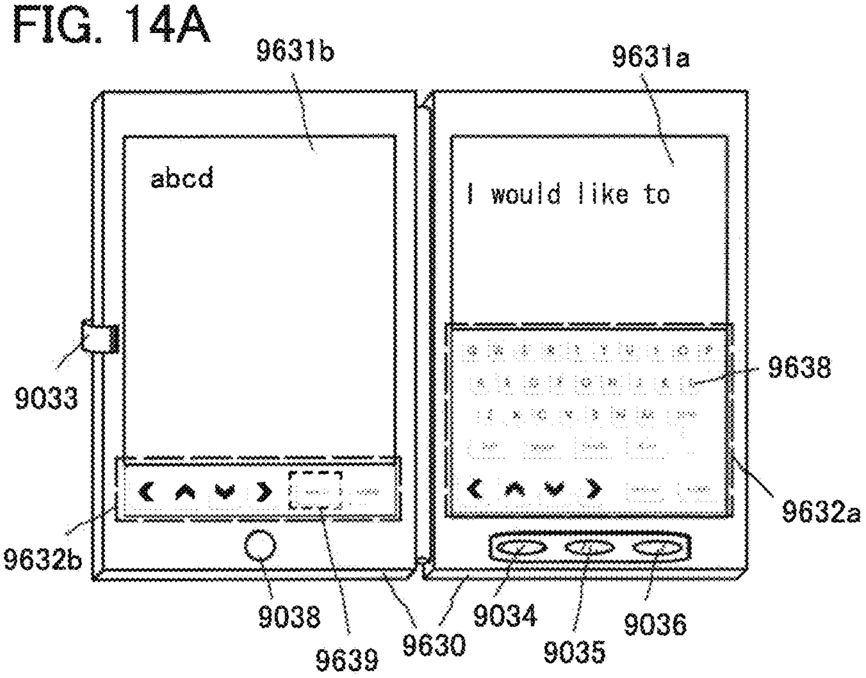
FIGS. 14A to 14C illustrate an electronic appliance.
Figure 14B:
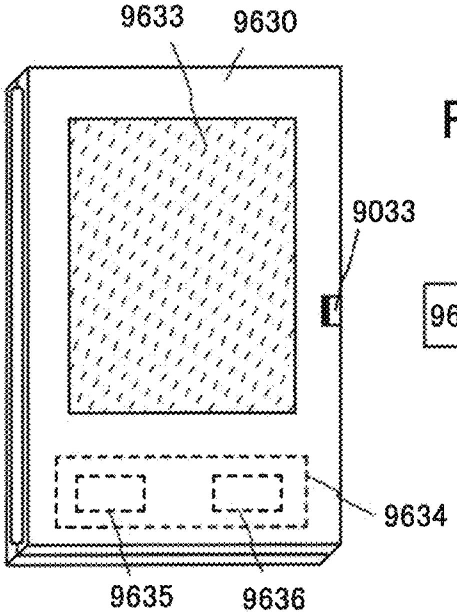

FIGS. 14A and 14B illustrate a tablet terminal that can be folded. In FIG. 14A, the tablet terminal is opened, and includes a housing 9630, a display portion 9631*a*, a display portion 9631*b*, a display-mode switching button 9034, a power button 9035, a power-saving-mode switching button 9036, a clip 9033, and an operation button 9038.

A CPU for performing image processing or arithmetic processing is used in the portable device illustrated in FIGS. 14A and 14B. As the CPU, the CPU described in Embodiment 4 can be used, in which case the CPU described in Embodiment 4 is used, power consumption of the portable device can be reduced.

The display device described in Embodiment 5 can be used for the display portions 9631*a* and 9631*b*. The use of the display device leads to an improvement in reliability.

A touch panel area 9632*a* can be provided in a part of the display portion 9631*a*, in which data can be input by touching displayed operation keys 9638. Note that FIG. 14A shows, as an example, that half of the area of the display portion 9631*a* has only a display function and the other half of the area has a touch panel function. However, the structure of the display portion 9631*a* is not limited to this, and all the area of the display portion 9631*a* may have a touch panel function. For example, all the area of the display portion 9631*a* can display keyboard buttons and serve as a touch panel while the display portion 9631*b* can be used as a display screen.

Like the display portion 9631*a*, part of the display portion 9631*b* can be a touch panel area 9632*b*. When a finger, a stylus, or the like touches the place where a button 9639 for switching to keyboard display is displayed in the touch panel, keyboard buttons can be displayed on the display portion 9631*b*.

Touch input can be performed concurrently on the touch panel areas 9632*a* and 9632*b*.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631*a* and the display portion 9631*b* have the same display area in FIG. 14A, one embodiment of the present invention is not limited to this example. The display portion 9631*a* and the display portion 9631*b* may have different areas or different display quality. For example, one of them may be a display panel that can display higher-definition images than the other.

The tablet terminal is closed in FIG. 14B. The tablet terminal includes the housing 9630, a solar battery 9633, a charge/discharge control circuit 9634, a battery 9635, and a DCDC converter 9636. Note that in FIG. 14B, a structure including a battery 9635 and a DCDC converter 9636 is illustrated as an example of the charge/discharge control circuit 9634.

Since the tablet terminal can be folded in two, the housing 9630 can be closed when the tablet is not in use. Thus, the display portions 9631*a* and 9631*b* can be protected, thereby providing a tablet terminal with high endurance and high reliability for long-term use.

The tablet terminal illustrated in FIGS. 14A and 14B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on a surface of the tablet terminal, can supply electric power to a touch panel, a display portion, an image signal processor, and the like. Note that the solar battery 9633 can be provided on one or both surfaces of the housing 9630 and the battery 9635 can be charged efficiently. When a lithium ion battery is used as the battery 9635, there is an advantage of downsizing or the like.

Figure 14C:
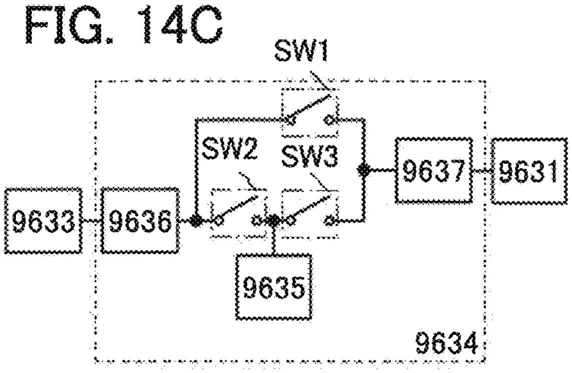

The structure and operation of the charge/discharge control circuit 9634 illustrated in FIG. 14B are described with reference to a block diagram of FIG. 14C. FIG. 14C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge/discharge control circuit 9634 in FIG. 14B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 15A:
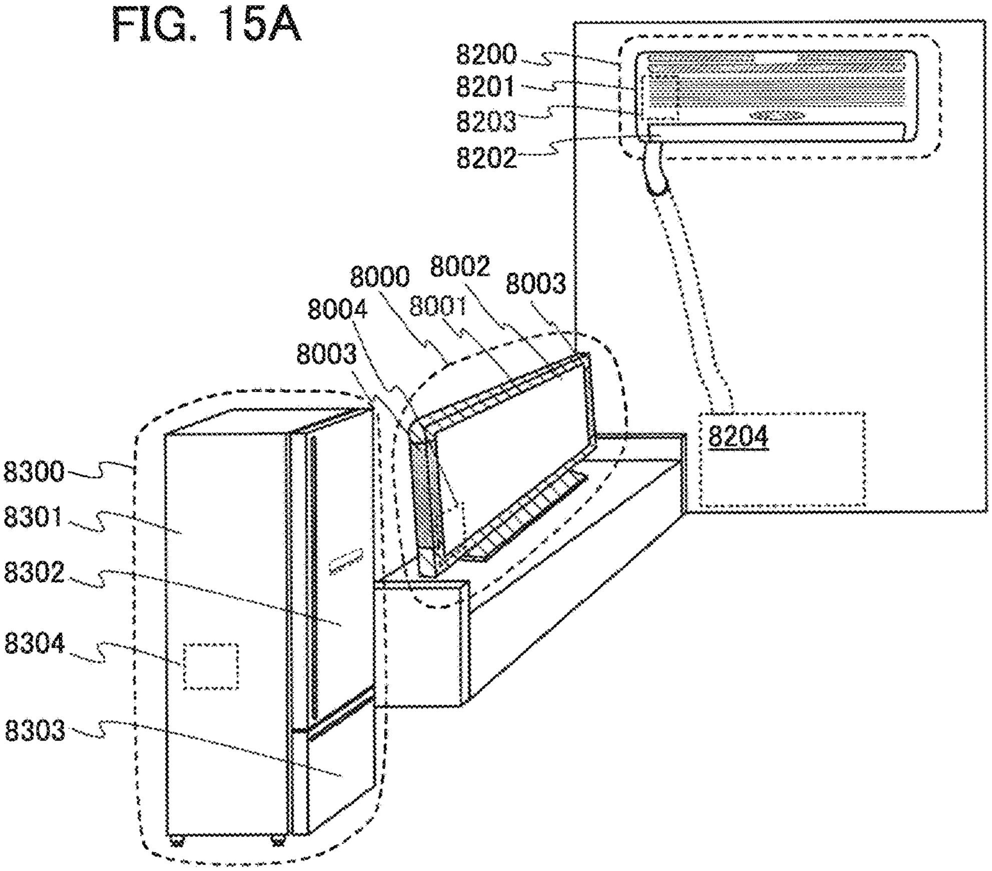
FIGS. 15A to 15C illustrate electronic appliances.

In a television device 8000 in FIG. 15A, a display portion 8002 is incorporated in a housing 8001. The display portion 8002 displays an image and a speaker portion 8003 can output sound.

The display device described in Embodiment 5 can be used for the display portion 8002, and in the case of using the display device, the reliability of the display portion 8002 can be improved.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television device 8000 may include a CPU for performing information communication or a memory. The CPU described in Embodiment 4 can be used in the television device 8000.

In FIG. 15A, an air conditioner including an indoor unit 8200 and an outdoor unit 8204 is an example of an electronic appliance including the CPU of Embodiment 6. Specifically, the indoor unit 8200 includes a housing 8201, an air outlet 8202, a CPU 8203, and the like. FIG. 15A shows the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. By using the CPU described in Embodiment 4 as the CPU in the air conditioner, power consumption can be reduced.

In FIG. 15A, an electric refrigerator-freezer 8300 is an example of an electronic appliance which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 15A, the CPU 8304 is provided in the housing 8301. When the CPU described in Embodiment 4 is used as the CPU 8304 of the electric refrigerator-freezer 8300, power saving can be achieved.

Figure 15B:
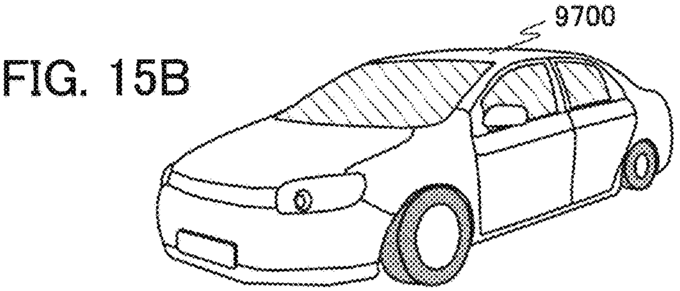
Figure 15C:
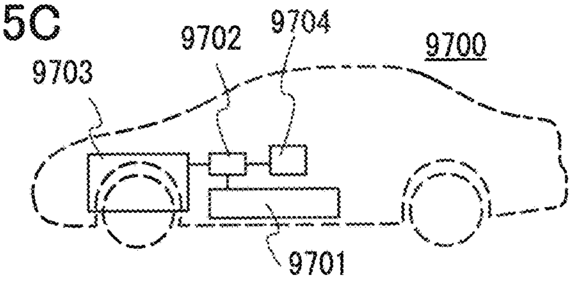
Figure 16:
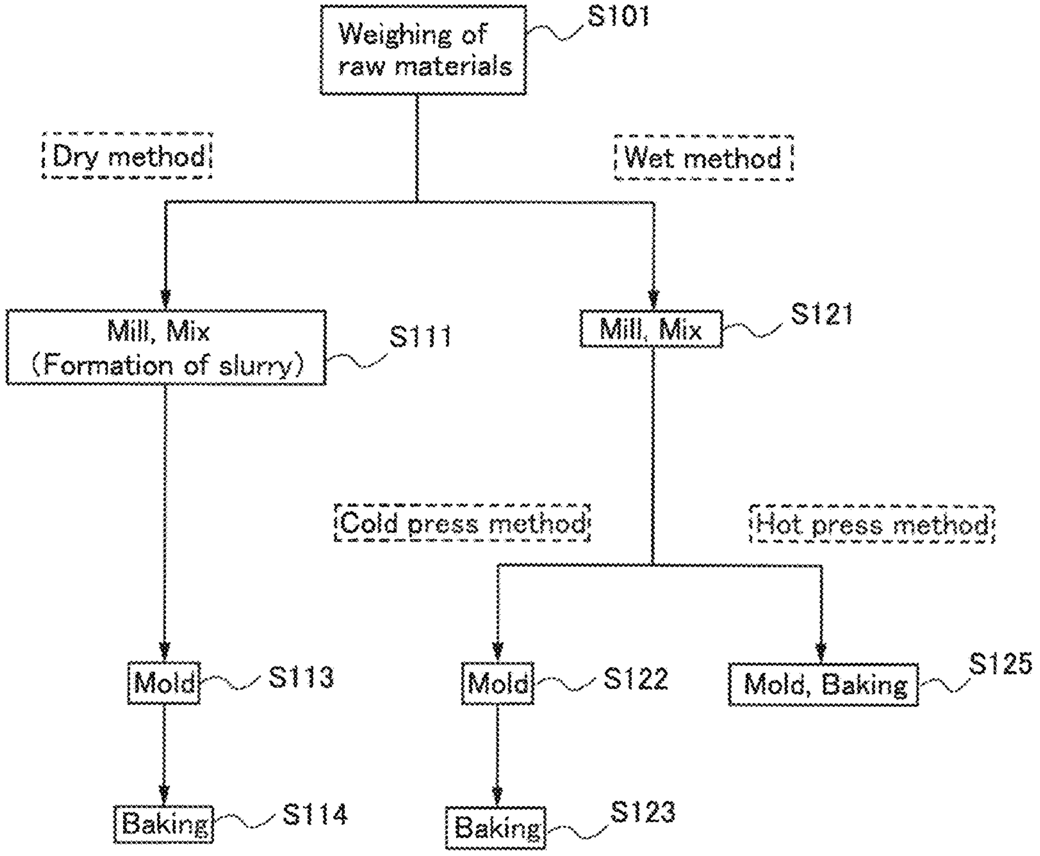
FIG. 16 is a flowchart showing manufacturing steps of a sputtering target of one embodiment of the present invention.

FIG. 15B illustrates an example of an electric vehicle which is an example of an electronic appliance. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the CPU described in Embodiment 4 is used as the CPU in the electric vehicle 9700, power saving can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented combining with another embodiment as appropriate.

Example 1

In this example, the evaluation results of the crystal state of a stack of oxide semiconductor films are described.

Sample A, Sample B, and Comparative Sample C formed in this example are described.

Figure 11:
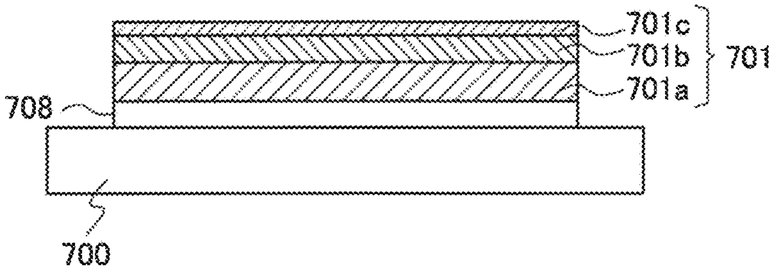
FIG. 11 is a schematic view illustrating a cross-sectional structure of a sample.
Figure 18A:
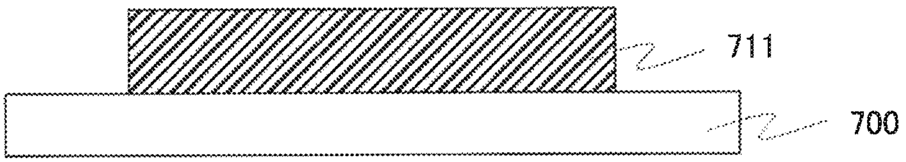
FIG. 18A is a schematic view illustrating a cross-sectional structure of a sample for comparison and FIG. 18B shows XRD measurement results of the sample.

FIG. 11 illustrates a structure of Sample A and Sample B and FIG. 18A illustrates a structure of Comparative Sample C.

First, a method for forming Sample A is described. As a substrate 700, a silicon substrate was used, and the silicon substrate was subjected to reverse sputtering. The reverse sputtering treatment was performed under the following condition: a sputtering apparatus was used; argon was supplied to a treatment chamber of the sputtering apparatus at a flow rate of 50 sccm; the pressure in the treatment chamber was 0.6 Pa; an RF power source of 200 W was supplied, the treatment time was 3 minutes; and the substrate temperature was room temperature.

Next, as a base insulating film 708, a 300-nm-thick silicon oxide film nm was formed over the silicon substrate. The silicon oxide film was formed in the following manner: silicon oxide was used as a sputtering target, oxygen was supplied to a treatment chamber of a sputtering apparatus as a sputtering gas at a flow rate of 50 sccm, the pressure in the treatment chamber was controlled to 0.4 Pa, and an RF power of 1.5 kW was supplied. Note that the substrate temperature in the deposition of the silicon oxide film was set at 100° C.

Then, the silicon oxide film was subjected to CMP treatment so that the surface roughness (Ra) of the silicon oxide film was 0.2 nm. The conditions of the polishing treatment were as follows: a hard polyurethane pad was used as a polishing pad for CMP; a 5-fold dilute solution of NP8020 (produced by Nitta Haas Incorporated, a grain size of silica is 60 nm to 80 nm) was used as a slurry; the polishing time was 2 minutes; the polishing pressure was 0.01 MPa, the number of spindle rotations on the substrate fixed side was 60 rpm; and the number of rotations of a table on which the polishing cloth (polishing pad) was fixed was 56 rpm.

Then, a 20-nm-thick In—Ga—Zn oxide film was formed over the silicon oxide film as a first oxide semiconductor film 701*a* using a sputtering target having an atomic ratio of In:Ga:Zn=1:3:2. The In—Ga—Zn oxide film was formed under the following condition: argon and oxygen were supplied, as a sputtering gas, into a treatment chamber of a sputtering apparatus at flow rates of 30 sccm and 15 sccm, respectively; the pressure in the treatment chamber was controlled to 0.4 Pa; and the DC power was 0.5 kW. Note that the substrate temperature in the deposition of the In—Ga—Zn oxide film was set at 200° C.

Next, a 15-nm-thick In—Ga—Zn oxide film was formed as a second oxide semiconductor film 701*b* using a sputtering target having an atomic ratio of In:Ga:Zn=1:1:1. The In—Ga—Zn oxide film was formed under the following condition: argon and oxygen were supplied, as a sputtering gas, into a treatment chamber of a sputtering apparatus at flow rates of 30 sccm and 15 sccm, respectively; the pressure in the treatment chamber was controlled to 0.4 Pa; and the DC power was 0.5 kW. Note that the substrate temperature in the deposition of the In—Ga—Zn oxide film was set at 300° C.

Then, a 5-nm-thick In—Ga—Zn film was formed as a third oxide semiconductor film 701*c* using a sputtering target having an atomic ratio In:Ga:Zn=1:3:2. The In—Ga—Zn oxide film was formed under the following condition: argon and oxygen were supplied into a treatment chamber of a sputtering apparatus at flow rates of 30 sccm and 15 sccm, respectively; the pressure in the treatment chamber was controlled to 0.4 Pa; and the DC power was 0.5 kW. Note that the substrate temperature in the deposition of the In—Ga—Zn oxide film was set at 200° C.

The first to third oxide semiconductor films 701*a* to 701*c* were successively formed without being exposed to the air.

Through the foregoing steps, Sample A was formed.

Next, a method for forming Sample B is described. Sample B is different from Sample A in the structure of a stack 701 of oxide semiconductor films. Only the difference is described below.

After the base insulating film 708 is subjected to CMP treatment, the first oxide semiconductor film 701*a*, the second oxide semiconductor film 701*b*, and the third oxide semiconductor film 701*c* were formed.

A 20-nm-thick In—Ga—Zn oxide film was formed as the first oxide semiconductor film 701*a* using a sputtering target having an atomic ratio of In:Ga:Zn=1:3:2. The In—Ga—Zn oxide film was formed under the following condition: argon and oxygen were supplied, as a sputtering gas, into a treatment chamber of a sputtering apparatus at flow rates of 30 sccm and 15 sccm, respectively; the pressure in the treatment chamber was controlled to 0.4 Pa; and the DC power was 0.5 kW. Note that the substrate temperature in the deposition of the In—Ga—Zn oxide film was set at 200° C.

Next, a 15-nm-thick In—Ga—Zn oxide film was formed as the second oxide semiconductor film 701*b* using a sputtering target having an atomic ratio of In:Ga:Zn=1:1:1. The In—Ga—Zn oxide film was formed under the following condition: argon and oxygen were supplied, as a sputtering gas, into a treatment chamber of a sputtering apparatus at flow rates of 30 sccm and 15 sccm, respectively; the pressure in the treatment chamber was controlled to 0.4 Pa; and the DC power was 0.5 kW. Note that the substrate temperature in the deposition of the In—Ga—Zn oxide film was set at 400° C.

Then, a 5-nm-thick In—Ga—Zn oxide film was formed as the third oxide semiconductor film 701*c* using a sputtering target having an atomic ratio of In:Ga:Zn=1:3:2. The In—Ga—Zn oxide film was formed under the following condition: argon and oxygen were supplied, as a sputtering gas, into a treatment chamber of a sputtering apparatus at flow rates of 30 sccm and 15 sccm, respectively; the pressure in the treatment chamber was controlled to 0.4 Pa; and the DC power was 0.5 kW. Note that the substrate temperature in the deposition of the In—Ga—Zn oxide film was set at 200° C.

Through the foregoing steps, Sample B was formed.

Next, a method for forming Comparative Sample C is described. As the substrate 700, a silicon substrate was used.

Then, a 100-nm-thick In—Ga—Zn oxide film was formed as an oxide semiconductor film 711 over the silicon substrate using a sputtering target having an atomic ratio of In:Ga:Zn=1:3:2. The In—Ga—Zn oxide film was formed under the following condition: argon and oxygen were supplied, as a sputtering gas, into a treatment chamber of a sputtering apparatus at flow rates of 30 sccm and 15 sccm, respectively; the pressure in the treatment chamber was controlled to 0.4 Pa; and the DC power was 0.5 kW. Note that the substrate temperature in the deposition of the In—Ga—Zn oxide film was set at 200° C.

Through the foregoing steps, Comparative Sample C was formed.

The crystalline states of Sample A, Sample B, and Comparative Sample C were measured by X-ray diffraction (XRD).

Figure 12A:
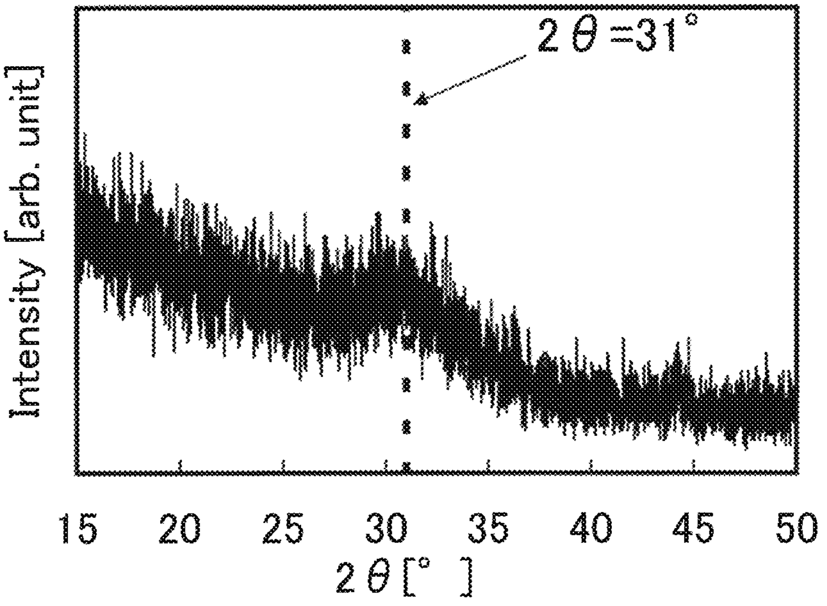
FIGS. 12A and 12B show XRD measurement results of samples.
Figure 12B:
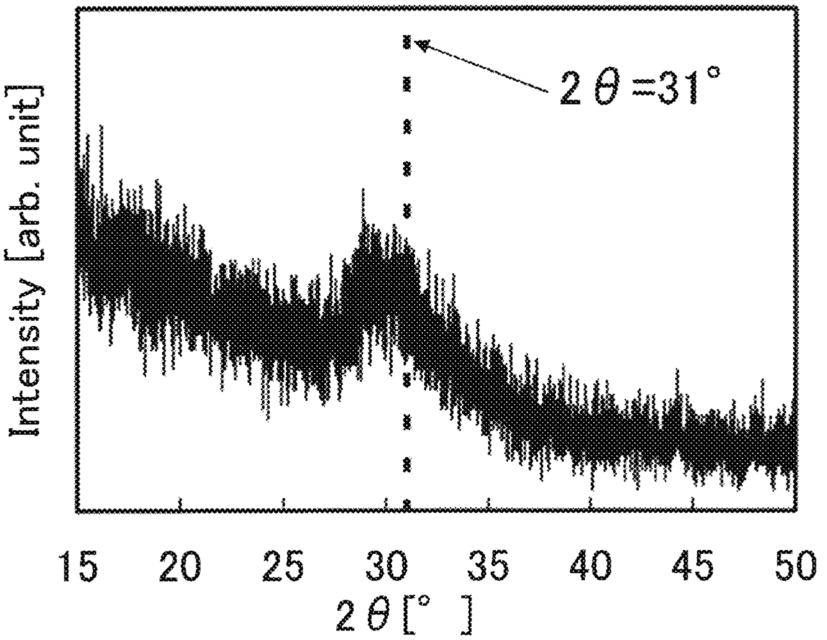
Figure 18B:
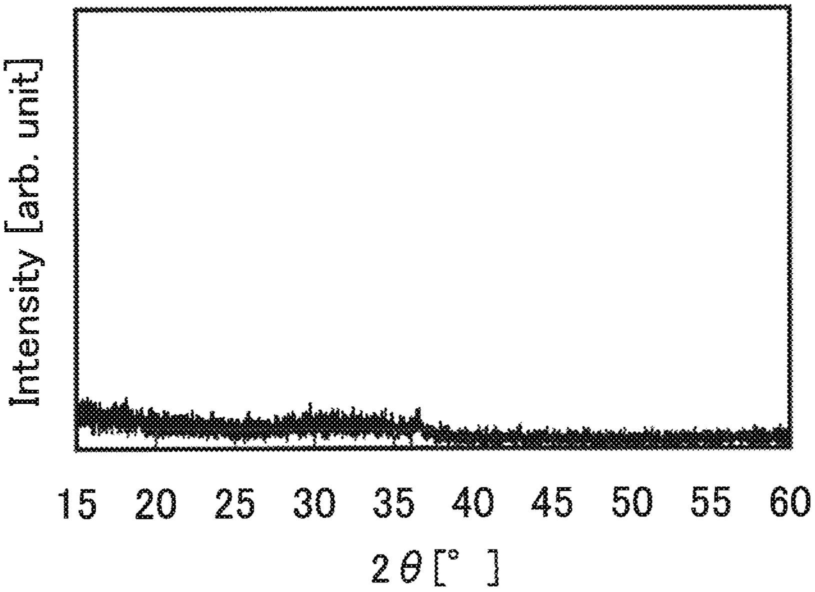

FIG. 12A shows XRD measurement results of the In—Ga—Zn oxide film of Sample A. FIG. 12B shows XRD measurement results of the In—Ga—Zn oxide semiconductor film of Sample B. FIG. 18B shows XRD measurement results of the In—Ga—Zn oxide film of Comparative Sample C. In FIGS. 12A and 12B and FIG. 18B, the horizontal axis represents the diffraction angle 2θ[°] and the vertical axis represents the X-ray diffraction intensity (given unit).

As shown in FIGS. 12A and 12B, a peak derived from a crystal was observed at around 2θ=31° in Sample A and Sample B. In contrast, as shown in FIG. 18B, a peak derived from a crystal was not observed in Sample C.

To examine the presence of crystal grains, the size of crystal grains, and the distribution state of crystal grains, cross sections of Sample A and Sample B were cut out by FIB. Then, the cross sections were observed with a high resolution transmission electron microscope ("H9000-NAR": TEM manufactured by Hitachi, Ltd.) at an acceleration voltage of 300 kV.

Figure 13A:
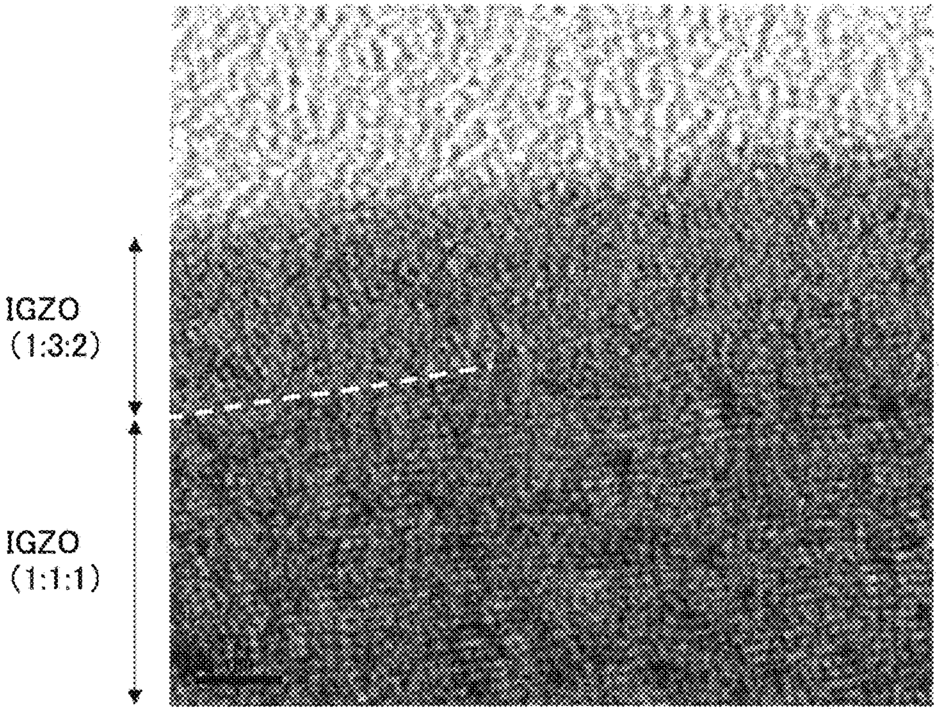
FIGS. 13A and 13B are photographs showing cross sections of samples.
Figure 13B:
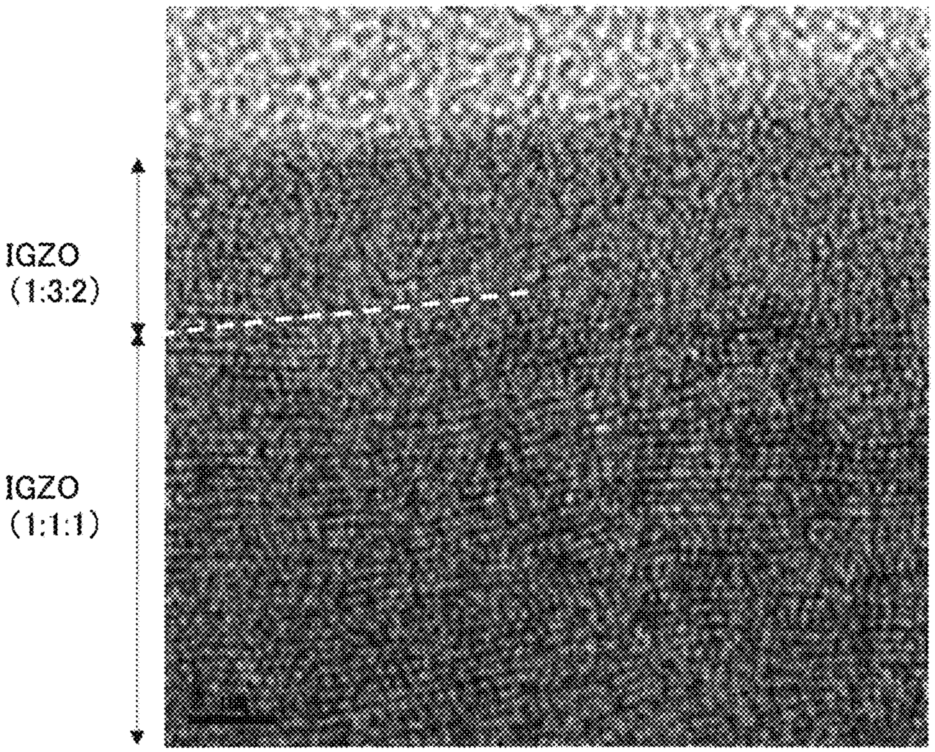

FIGS. 13A and 13B show the cross section observation results of the interface between the second oxide semiconductor film 701*b* and the third oxide semiconductor film 701*c* in Sample A and Sample B. FIG. 13A shows the results of Sample A with 100,000 magnification, and FIG. 13B shows the results of Sample B with 100,000 magnification.

As shown in FIGS. 13A and 13B, crystals which were c-axis-aligned in a direction substantially perpendicular to the surface were observed in the second oxide semiconductor film 701*b*.

Further, also in the third oxide semiconductor film 701*c*, crystals which were c-axis-aligned in a direction substantially perpendicular to a crystallized region, i.e., the surface were also observed at the interface with the second oxide semiconductor film 701*b*.

Example 2

In this example, TOF-SIMS analysis results of a stack in which first to third oxide semiconductor films are stacked in this order and XPS analysis results thereof are described.

First, a sample for analysis is described.

The sample for the analysis of this example includes the first oxide semiconductor film which is provided over an n-type silicon substrate, the second oxide semiconductor film which is provided over the first oxide semiconductor film, and the third oxide semiconductor film which is provided over the second oxide semiconductor film. The first to third oxide semiconductor films each have a thickness of 10 nm.

The first to third oxide semiconductor films were formed in such a manner that oxide semiconductor films were sequentially deposited by a sputtering method. The first oxide semiconductor film was formed under the following condition: a metal oxide target (manufactured by a cold press method) having an atomic ratio of In:Ga:Zn=1:3:2 was used, and the deposition atmosphere contained oxygen at 10% (the flow rate of oxygen: 20 sccm; the flow rate of argon: 180 sccm). The second oxide semiconductor film was formed under the following condition: a metal oxide target (manufactured by a cold press method) having an atomic ratio of In:Ga:Zn=3:1:2 was used, and the deposition atmosphere contained oxygen at 100% (the flow rate of oxygen: 200 sccm). The third oxide semiconductor film was formed under the following condition: a metal oxide target (manufactured by a wet method) having an atomic ratio of In:Ga:Zn=1:1:1 was used, and the deposition atmosphere contained oxygen at 10% (the flow rate of oxygen: 20 sccm; the flow rate of argon: 180 sccm). Further, the pressure of a treatment chamber in a sputtering apparatus was set to 0.6 Pa and an AC power of 5 kW was used at the time of forming the first to third oxide semiconductor films.

TOF-SIMS analysis was performed on the sample. In that analysis, TOF.SIMS 5 manufactured by ION-TOF GmbH was used as an analyzer and Bi was used as a primary ion source. Further, the analysis was performed in the depth direction and an analysis area was 50 μm square.

Figure 19:
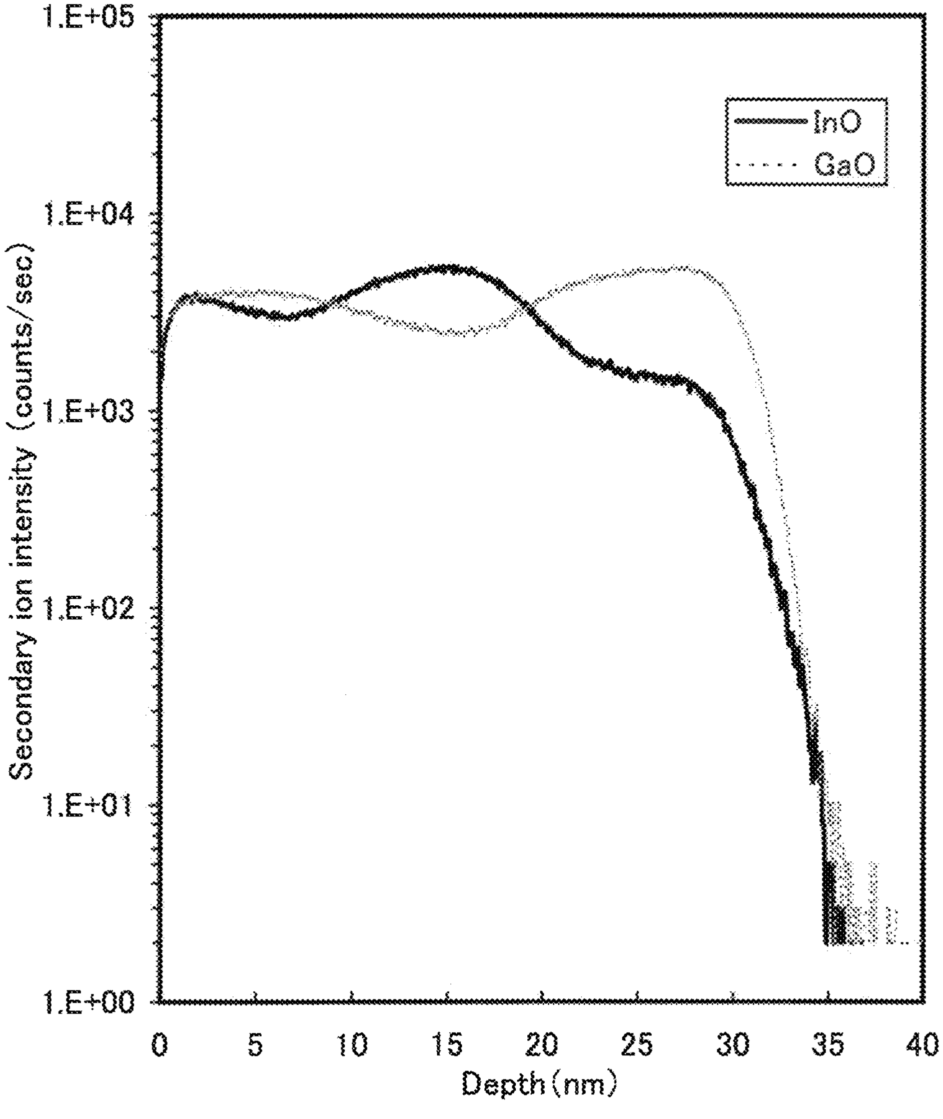
FIG. 19 is a graph showing analysis results by TOF-SIMS.

Analysis results which relate to In and Ga of the TOF-SIMS analysis results are shown in FIG. 19. In FIG. 19, the horizontal axis represents the depth in the sample (the thickness direction) and the vertical axis represents the secondary ion intensity.

In FIG. 19, an area in the depth range of greater than or equal to 0 nm and less than or equal to 10 nm is the region of the first oxide semiconductor film; an area in the depth range of greater than 10 nm and less than or equal to 20 nm is the region of the second oxide semiconductor film; and an area in the depth range of greater than 20 nm and less than or equal to 30 nm is the region of the third oxide semiconductor film.

In FIG. 19, the second oxide semiconductor film has higher ion intensity corresponding to InO than the first and third oxide semiconductor films.

In FIG. 19, the second oxide semiconductor film has lower ion intensity corresponding to GaO than the first and third oxide semiconductor films.

In addition, XPS analysis was performed on the sample in the depth direction. In the analysis, VersaProbe manufactured by ULVAC-PHI Inc. was used as a measurement apparatus and Al was used as an X-ray source. Further, Ar was used as a sputtering ion and the accelerating voltage was 3.0 kV. Further, the detection area was 100 μmϕ.

Figure 20:
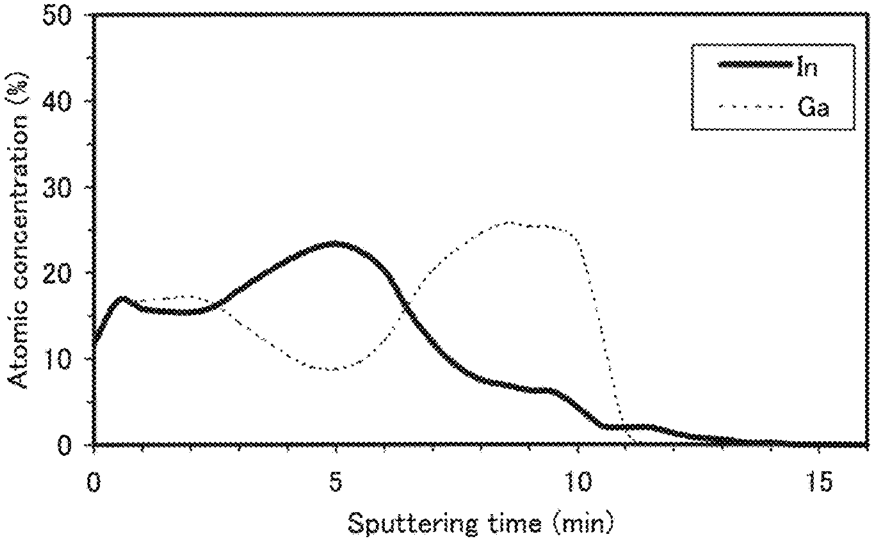
FIG. 20 is a graph showing analysis results by XPS.

Analysis results relating to In and Ga of the XPS analysis results are shown in FIG. 20. In FIG. 20, the horizontal axis represents sputtering time and the vertical axis represents the atomic concentration. Note that the sputtering time in FIG. 20 corresponds to the depth direction in the sample in FIG. 19.

The results FIG. 20 also show that in the first oxide semiconductor film and the third oxide semiconductor film, the atomic concentration of Ga is higher than that of In. In in the second oxide semiconductor film, the atomic concentration of In is higher than that of Ga.

According to the above description, it is found that a plurality of kinds of oxide semiconductor films which differ in, for example, the amount of In or the amount of Ga can be formed using sputtering targets which vary in atomic ratio.

This application is based on Japanese Patent Application serial no. 2012-178724 filed with Japan Patent Office on Aug. 10, 2012, the entire contents of which are hereby incorporated by reference.

What is claimed is:

1. A semiconductor device comprising:
a substrate;
a first oxide semiconductor film over the substrate;
a second oxide semiconductor film over the first oxide semiconductor film;
a third oxide semiconductor film over the second oxide semiconductor film;
a gate electrode overlapping with the first oxide semiconductor film, the second oxide semiconductor film, and the third oxide semiconductor film; and
a source electrode and a drain electrode each electrically connected to the second oxide semiconductor film,
wherein the second oxide semiconductor film comprises In, Ga and Zn,
wherein the first oxide semiconductor film comprises a first side surface and a second side surface at edges in a channel length direction,
wherein the second oxide semiconductor film comprises a third side surface and a fourth side surface at edges in the channel length direction,
wherein the third oxide semiconductor film is in direct contact with each of the first side surface, the second side surface, the third side surface and the fourth side surface,
wherein the third oxide semiconductor film comprises a source region, a drain region, a first region, and a second region,
wherein the drain region is between the first region and the second region and the first region is between the source region and the drain region when seen from a direction perpendicular to a top surface of the substrate, and
wherein the third oxide semiconductor film extends beyond both edges of the drain electrode in the channel length direction.

2. The semiconductor device according to claim 1,
wherein each of the first side surface, the second side surface, the third side surface and the fourth side surface is inclined.

3. The semiconductor device according to claim 1,
wherein each of the source electrode and the drain electrode are over the third oxide semiconductor film.

4. The semiconductor device according to claim 1,
wherein the second oxide semiconductor film has a higher indium content than the first oxide semiconductor film and the third oxide semiconductor film.

5. The semiconductor device according to claim 1,
wherein each of the first oxide semiconductor film and the third oxide semiconductor film comprises In, Ga and Zn.

6. The semiconductor device according to claim 1,
wherein a bottom of a conduction band in the second oxide semiconductor film is deeper from a vacuum level than a bottom of a conduction band in the first oxide semiconductor film and a bottom of a conduction band in the third oxide semiconductor film.

7. The semiconductor device according to claim 1, further comprising:
a first transistor over the substrate; and
a first insulating film over the first transistor and under the first oxide semiconductor film.

8. The semiconductor device according to claim 1,
wherein the source electrode does not overlap with the second region, and
wherein the drain electrode does not overlap with the second region.

9. A semiconductor device comprising:
a substrate;
a first oxide semiconductor film over the substrate;
a second oxide semiconductor film over the first oxide semiconductor film;
a third oxide semiconductor film over the second oxide semiconductor film;
a gate electrode overlapping with the first oxide semiconductor film, the second oxide semiconductor film, and the third oxide semiconductor film; and
a source electrode and a drain electrode each electrically connected to the second oxide semiconductor film,
wherein each of the first oxide semiconductor film, the second oxide semiconductor film and the third oxide semiconductor film comprises In, Ga and Zn,
wherein the second oxide semiconductor film comprises a first side surface and a second side surface at edges in a channel length direction,
wherein the third oxide semiconductor film is in direct contact with each of the first side surface and the second side surface,
wherein the third oxide semiconductor film comprises a source region, a drain region, a first region, and a second region,
wherein the drain region is between the first region and the second region and the first region is between the source region and the drain region when seen from a direction perpendicular to a top surface of the substrate,
wherein the third oxide semiconductor film extends beyond both edges of the drain electrode in the channel length direction, and
wherein the second oxide semiconductor film has a higher indium content than the first oxide semiconductor film and the third oxide semiconductor film.

10. The semiconductor device according to claim 9,
wherein each of the first side surface and the second side surface are inclined.

11. The semiconductor device according to claim 9,
wherein each of the source electrode and the drain electrode are over the third oxide semiconductor film.

12. The semiconductor device according to claim 9,
wherein a bottom of a conduction band in the second oxide semiconductor film is deeper from a vacuum level than a bottom of a conduction band in the first oxide semiconductor film and a bottom of a conduction band in the third oxide semiconductor film.

13. The semiconductor device according to claim 9, further comprising:
a first transistor over the substrate; and
a first insulating film over the first transistor and under the first oxide semiconductor film.

14. The semiconductor device according to claim 9,
wherein the source electrode does not overlap with the second region, and
wherein the drain electrode does not overlap with the second region.

* * * * *